United States Patent
Sharma et al.

(10) Patent No.: US 12,260,925 B2
(45) Date of Patent: Mar. 25, 2025

(54) DATA INTEGRITY CHECK IN NON-VOLATILE STORAGE

(71) Applicant: Western Digital Technologies, Inc., San Jose, CA (US)

(72) Inventors: Sugandha Sharma, Pleasanton, CA (US); Mahim Raj Gupta, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/358,605

(22) Filed: Jul. 25, 2023

(65) Prior Publication Data

US 2024/0312546 A1  Sep. 19, 2024

Related U.S. Application Data

(60) Provisional application No. 63/490,061, filed on Mar. 14, 2023.

(51) Int. Cl.
*G11C 29/12* (2006.01)

(52) U.S. Cl.
CPC .. *G11C 29/1201* (2013.01); *G11C 2029/1202* (2013.01)

(58) Field of Classification Search
CPC ............................. G11C 29/12; G11C 29/1201
See application file for complete search history.

(56) References Cited

U.S. PATENT DOCUMENTS

| | | |
|---|---|---|
| 9,547,571 B2 | 1/2017 | Yang et al. |
| 10,083,069 B2 | 9/2018 | Jeon et al. |
| 10,147,500 B2 | 12/2018 | Cai et al. |
| 10,218,789 B2 | 2/2019 | Yang et al. |
| 10,896,123 B2 | 1/2021 | Yang et al. |
| 11,152,071 B1 * | 10/2021 | Arora ................. G11C 16/3418 |
| 11,282,564 B1 | 3/2022 | Rayaprolu et al. |
| 11,467,744 B2 * | 10/2022 | Arora ...................... G06F 3/064 |
| 2013/0070530 A1 * | 3/2013 | Chen .................... G11C 11/5628  365/185.11 |
| 2016/0163393 A1 * | 6/2016 | Liang ................... G11C 16/349  365/185.11 |
| 2016/0343449 A1 * | 11/2016 | Lee ......................... G11C 16/14 |
| 2018/0033491 A1 * | 2/2018 | Marelli .................. G11C 16/26 |

(Continued)

FOREIGN PATENT DOCUMENTS

WO    WO-2013070530 A1 * 5/2013 ................ F28B 1/06

*Primary Examiner* — Samir W Rizk
(74) *Attorney, Agent, or Firm* — Pearl Cohen Zedek Latzer Baratz LLP

(57) ABSTRACT

Technology is disclosed herein for checking data integrity in a non-volatile storage system. The storage system may operate in a first mode in which a data integrity check is performed in closed blocks until more than an allowed number of word lines fail the data integrity check. After a closed block has more than the allowed number of the word lines fail the data integrity check, then the storage system may operate in a second mode in which a data integrity check is performed in open blocks. The allowed number of word lines may be equal to the number of word lines that can be recovered by XOR data in the event data is uncorrectable by an ECC engine. The data integrity check of a target word line in an open block may be performed after programming a word line adjacent to the target word line in the open block.

20 Claims, 22 Drawing Sheets

(56) References Cited

U.S. PATENT DOCUMENTS

| | | | |
|---|---|---|---|
| 2021/0373764 A1* | 12/2021 | Arora | G06F 3/0652 |
| 2022/0301637 A1 | 9/2022 | Tehrani et al. | |
| 2023/0297262 A1* | 9/2023 | Sasaki | G06F 3/0607 |
| | | | 711/154 |

* cited by examiner

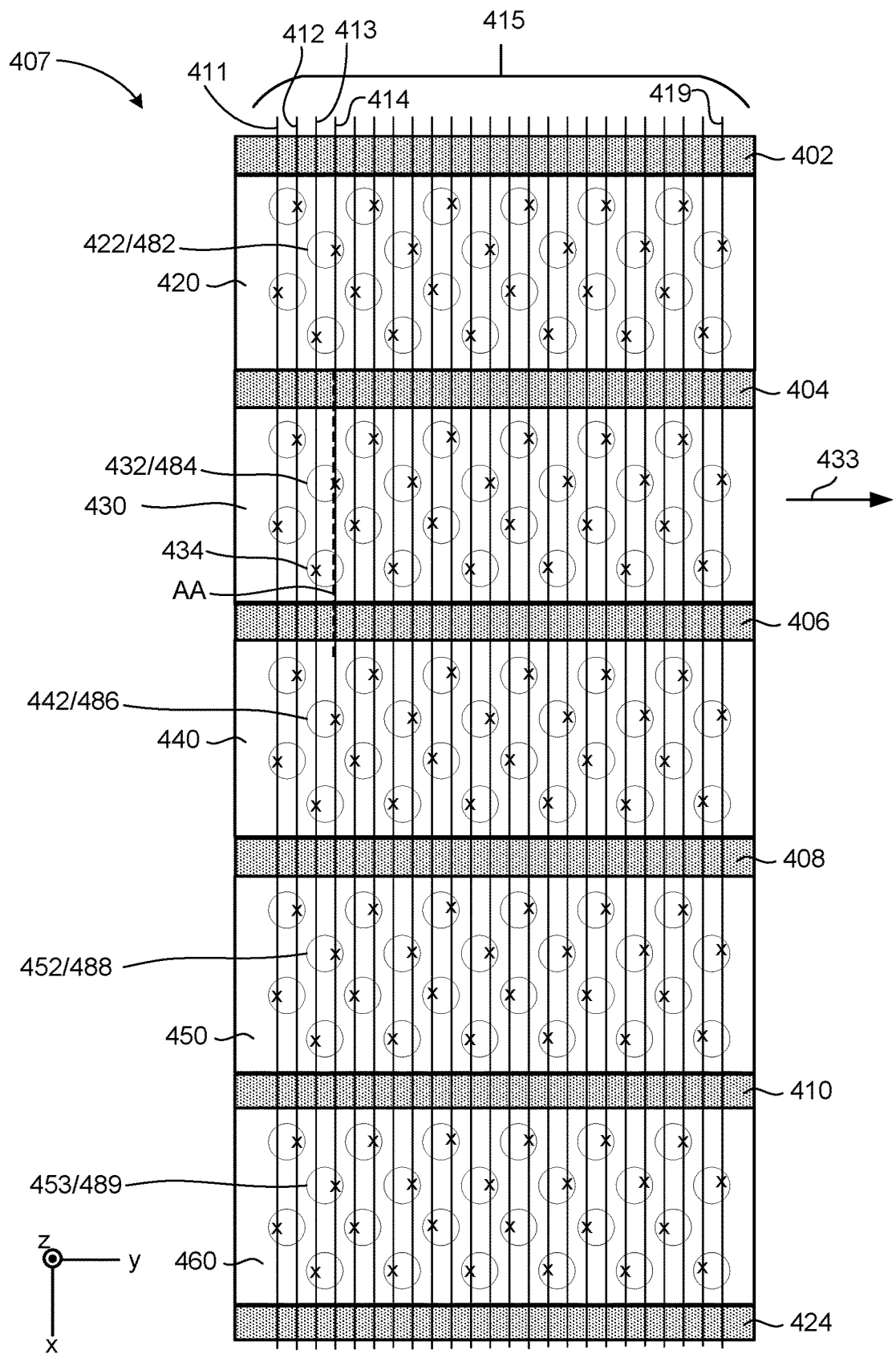

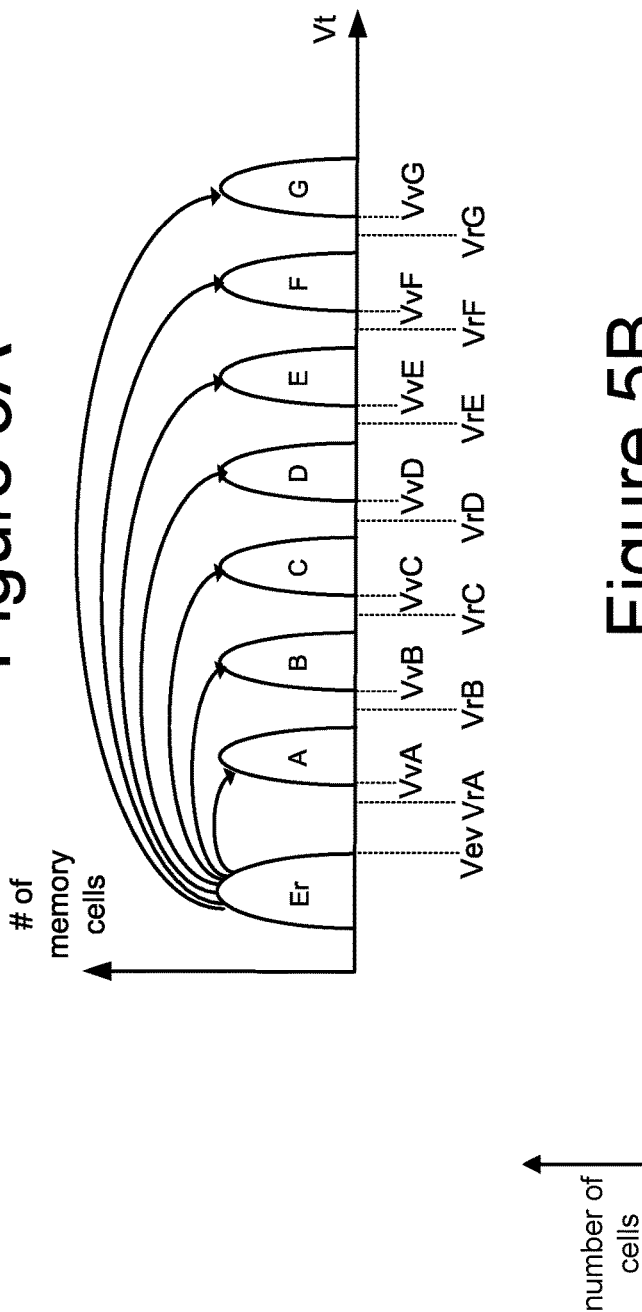
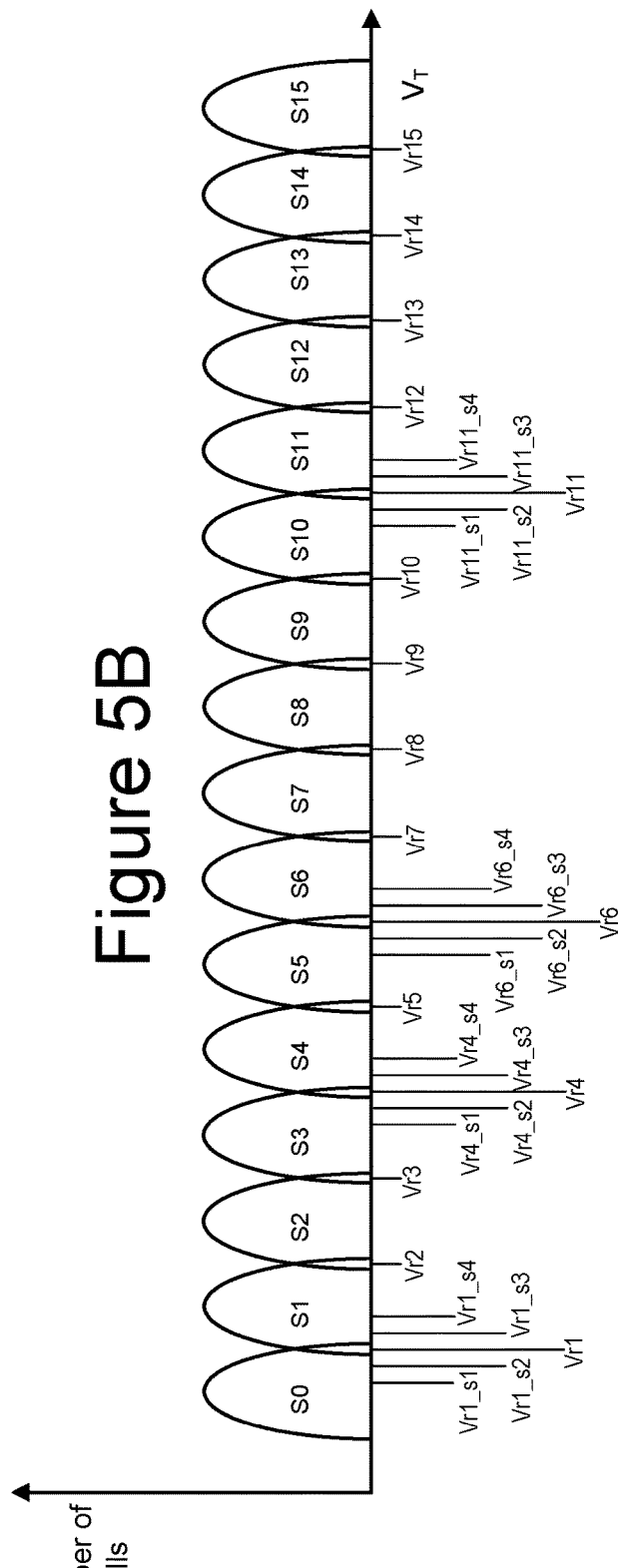

| WL# | P/E | TEST? |
|---|---|---|
| WL0 | PGM | DNT |
| WL1 | PGM | DNT |
| WL2 | PGM | DNT |
| WL3 | PGM | DNT |
| WL4 | PGM | DNT |
| WL5 | PGM | DNT |
| WL6 | PGM | DNT |
| WL7 | PGM | DNT |
| WL8 | PGM | TEST |
| WL9 | PGM | DNT |
| WL10 | PGM | DNT |
| WL11 | PGM | DNT |
| WL12 | PGM | DNT |
| WL13 | PGM | DNT |
| WL14 | PGM | DNT |
| WL15 | PGM | DNT |
| WL16 | PGM | DNT |
| WL17 | PGM | DNT |
| WL18 | PGM | TEST |
| WL19 | PGM | DNT |
| WL20 | PGM | DNT |
| WL21 | PGM | DNT |
| WL22 | PGM | DNT |
| WL23 | PGM | DNT |
| WL24 | PGM | DNT |
| WL25 | PGM | DNT |
| WL26 | PGM | TEST |
| WL27 | PGM | DNT |
| WL28 | PGM | DNT |
| WL29 | PGM | DNT |
| WL30 | PGM | DNT |
| WL31 | PGM | DNT |

| WL# | P/E | TEST? |
|---|---|---|
| WL0 | PGM | DNT |
| WL1 | PGM | DNT |
| WL2 | PGM | DNT |
| WL3 | PGM | DNT |
| WL4 | PGM | DNT |
| WL5 | PGM | DNT |
| WL6 | PGM | DNT |
| WL7 | PGM | DNT |
| WL8 | PGM | TEST |
| WL9 | PGM | DNT |
| WL10 | Erased | DNT |
| WL11 | Erased | DNT |
| WL12 | Erased | DNT |
| WL13 | Erased | DNT |
| WL14 | Erased | DNT |
| WL15 | Erased | DNT |
| WL16 | Erased | DNT |
| WL17 | Erased | DNT |
| WL18 | Erased | DNT |
| WL19 | Erased | DNT |
| WL20 | Erased | DNT |
| WL21 | Erased | DNT |
| WL22 | Erased | DNT |
| WL23 | Erased | DNT |
| WL24 | Erased | DNT |
| WL25 | Erased | DNT |
| WL26 | Erased | DNT |
| WL27 | Erased | DNT |
| WL28 | Erased | DNT |
| WL29 | Erased | DNT |
| WL30 | Erased | DNT |
| WL31 | Erased | DNT |

| WL# | P/E | TEST? |
|---|---|---|
| WL0 | PGM | DNT |
| WL1 | PGM | DNT |
| WL2 | PGM | DNT |
| WL3 | PGM | DNT |
| WL4 | PGM | DNT |
| WL5 | PGM | DNT |
| WL6 | PGM | DNT |
| WL7 | PGM | DNT |
| WL8 | PGM | DNT |
| WL9 | PGM | DNT |
| WL10 | PGM | DNT |
| WL11 | PGM | DNT |
| WL12 | PGM | DNT |
| WL13 | PGM | DNT |
| WL14 | PGM | DNT |
| WL15 | PGM | DNT |
| WL16 | PGM | DNT |
| WL17 | PGM | DNT |
| WL18 | PGM | TEST |
| WL19 | PGM | DNT |
| WL20 | Erased | DNT |
| WL21 | Erased | DNT |
| WL22 | Erased | DNT |
| WL23 | Erased | DNT |
| WL24 | Erased | DNT |
| WL25 | Erased | DNT |
| WL26 | Erased | DNT |
| WL27 | Erased | DNT |
| WL28 | Erased | DNT |
| WL29 | Erased | DNT |
| WL30 | Erased | DNT |
| WL31 | Erased | DNT |

| WL# | P/E | TEST? |
|---|---|---|
| WL0 | PGM | DNT |
| WL1 | PGM | DNT |
| WL2 | PGM | DNT |
| WL3 | PGM | DNT |
| WL4 | PGM | DNT |
| WL5 | PGM | DNT |
| WL6 | PGM | DNT |
| WL7 | PGM | DNT |
| WL8 | PGM | DNT |
| WL9 | PGM | DNT |
| WL10 | PGM | DNT |
| WL11 | PGM | DNT |
| WL12 | PGM | DNT |
| WL13 | PGM | DNT |
| WL14 | PGM | DNT |
| WL15 | PGM | DNT |
| WL16 | PGM | DNT |
| WL17 | PGM | DNT |
| WL18 | PGM | DNT |
| WL19 | PGM | DNT |
| WL20 | PGM | DNT |
| WL21 | PGM | DNT |
| WL22 | PGM | DNT |
| WL23 | PGM | DNT |
| WL24 | PGM | DNT |
| WL25 | PGM | DNT |
| WL26 | PGM | TEST |
| WL27 | PGM | DNT |
| WL28 | Erased | DNT |
| WL29 | Erased | DNT |
| WL30 | Erased | DNT |

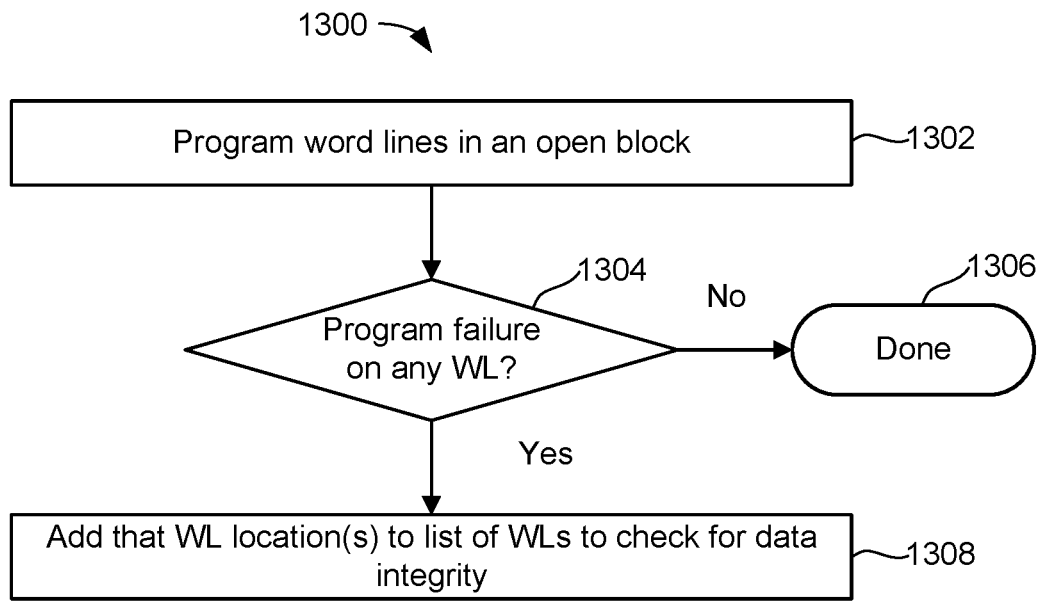
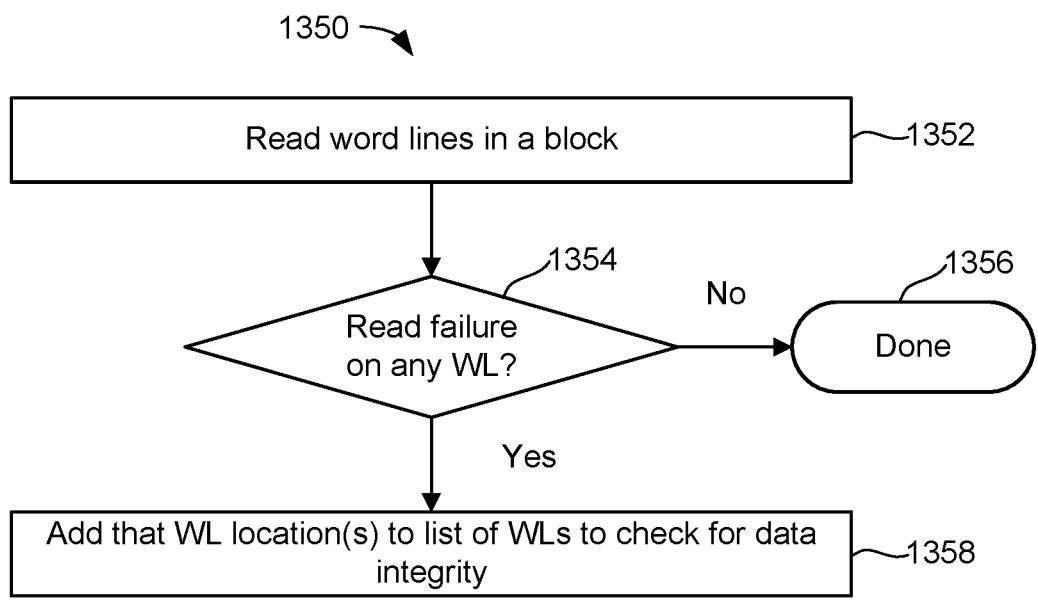

DATA INTEGRITY CHECK IN NON-VOLATILE STORAGE

CLAIM OF PRIORITY

The present application claims priority from U.S. Provisional Patent Application No. 63/490,061, entitled "DATA INTEGRITY CHECK IN NON-VOLATILE STORAGE," by Sharma et al., filed Mar. 14, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as physical blocks. For example, a physical block in a NAND memory system contains many NAND strings. A NAND string contains memory cell transistors connected in series, a drain side select gate at one end, and a source side select gate at the other end. Each NAND string is associated with a bit line. The physical block typically has many word lines that provide voltages to the control gates of the memory cell transistors. In some architectures, each word line connects to the control gate of one memory cell on each respective NAND string in the physical block.

For memory such as NAND, a large set of memory cells are erased prior to programming. In some cases, the memory cells of an entire physical block are erased as a group. In some cases, the memory cells of a portion of a physical block are erased as a group. Herein a portion of a physical block containing memory cells erased as a unit is referred to as an erase block. A physical block may contain one or more erase blocks. The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

The amount of charge stored in the memory cell may change after programming for a variety of reasons. One phenomena is loss of charge from the charge trapping layer over time, which may lower the Vt of the memory cell. Charge loss may be a function of factors including, but not limited to, time and temperature. Program disturb and read disturb could also change the amount of charge stored in a memory cell. Program disturb may occur to a particular memory cell as a result of programming other memory cells after the particular memory cell is programmed. In some cases, program disturb will unintentionally raise the Vt of the cell. Read disturb may occur to a memory cell as a result of reading that memory cell. A change in the amount of charge stored in the memory cell could alter the data state. Therefore, memory cells may suffer from data integrity issues. Such data integrity issues could be present soon after programming and may become worse over time. Some memory systems will check for data integrity issues from time to time.

It is typical for a storage system to use some type of error correcting code (ECC) to recover from errors including, but not limited to, data integrity issues. For example, an ECC encoder may generate parity bits based on the user data. For example, an ECC codeword (or more briefly "codeword") that contains the user data and the parity bits may be stored in the memory cells. An ECC decoder may be used to run an ECC algorithm to detect and correct errors in the data.

In one technique, the memory cells are sensed at one or more "hard bit reference voltages." A hard bit reference voltage is used to distinguish between two of the data states. However, sensed data states can sometimes vary from the written programmed states due to one or more factors. Error detection and correction decoding can be used to detect and correct data errors resulting from sensed states that do not match written programmed states. Some error correction decoding makes use of "hard bits," which are derived from sensing at the hard bit reference voltages.

Improved error correction capability may be achieved by decoding data using soft bits. Soft bits are derived from sensing the memory cells at a set of "soft bit reference voltages." Soft bits can indicate the reliability of a hard bit for each memory cell. To illustrate, soft bits may be used with ECC decoding to enhance error correction capability in non-volatile storage systems that may experience data integrity issues. For example, improved error correction capability may be achieved by using low-density parity-check (LDPC) codes, and including soft bit values, as inputs to a decoder as compared to a decoding scheme that is based on using hard bits only.

In addition to storing the ECC codewords in the non-volatile storage system, the system may compute and store XOR data. One technique is to accumulate XOR data based on successive bitwise exclusive OR (XOR) operations of the data that is programmed into the memory cells. For example, initially a bitwise XOR is performed between the first two units of data that are programmed into the memory cells to form the initial XOR accumulation. Then, as each additional unit of data is programmed, a bitwise XOR is performed between the current XOR accumulation and the new unit of data being programmed.

The XOR data may be used to recover the user data in the event that the ECC decoder fails to decode one or more ECC codewords, which is referred to herein as an unrecoverable by ECC decoder error (UECC). However, there are limits to how much user data can be recovered using XOR data in the event of an UECC. If too many units of the user data incur an UECC, then the user data cannot be recovered even with the XOR data.

The term "open block" is defined herein to refer to an erase block of memory cells that has been erased but has not yet been fully programmed (e.g., at least one word line in the erase block has not yet been programmed). As noted, an erase block could be programmed one word line at a time, such that in an open block memory cells connected to some of the word lines are programmed whereas memory cells connected to the other word lines remain erased. The term "closed block" is defined herein to refer to an erase block that has been fully programmed (e.g., all word lines in the erase block have been programmed). Note that the terms open block and closed block may be defined either in terms of a portion of a physical block or an entire physical block. For example, a closed block may correspond to all of a physical block or only a portion of the physical block, depending on whether the erase block is all of the physical block or only the portion of the physical block.

There are a number of potential problems with detecting data integrity issues. One potential problem is that performance is reduced if too many un-necessary data integrity checks are performed. However, it is also important that sufficient data integrity checks be made to avoid data loss. As noted above, if the data cannot be decoded, then XOR data could be used to recover the data. However, there are limits to how much data can be recovered with XOR data.

BRIEF DESCRIPTION OF THE DRAWINGS

Like-numbered elements refer to common components in the different figures.

FIG. 4B is a block diagram depicting a top view of a portion of physical block of memory cells.

FIG. 5A depicts threshold voltage (Vt) distributions when each memory cell stores three bits.

FIG. 5B depicts threshold voltage (Vt) distributions when each memory cell stores four bits.

FIG. 9 depicts an example table of word lines to test in a closed block.

FIGS. 11A, 11B, and 11C depict tables that shows program/erase status of word lines in an open block and whether to test a word line for data integrity.

FIG. 13A is a flowchart of one embodiment of a process of adding a word line to the list in response to a program failure.

FIG. 13B is a flowchart of one embodiment of a process of adding a word line to the list in response to a read failure.

DETAILED DESCRIPTION

Figure 1A:
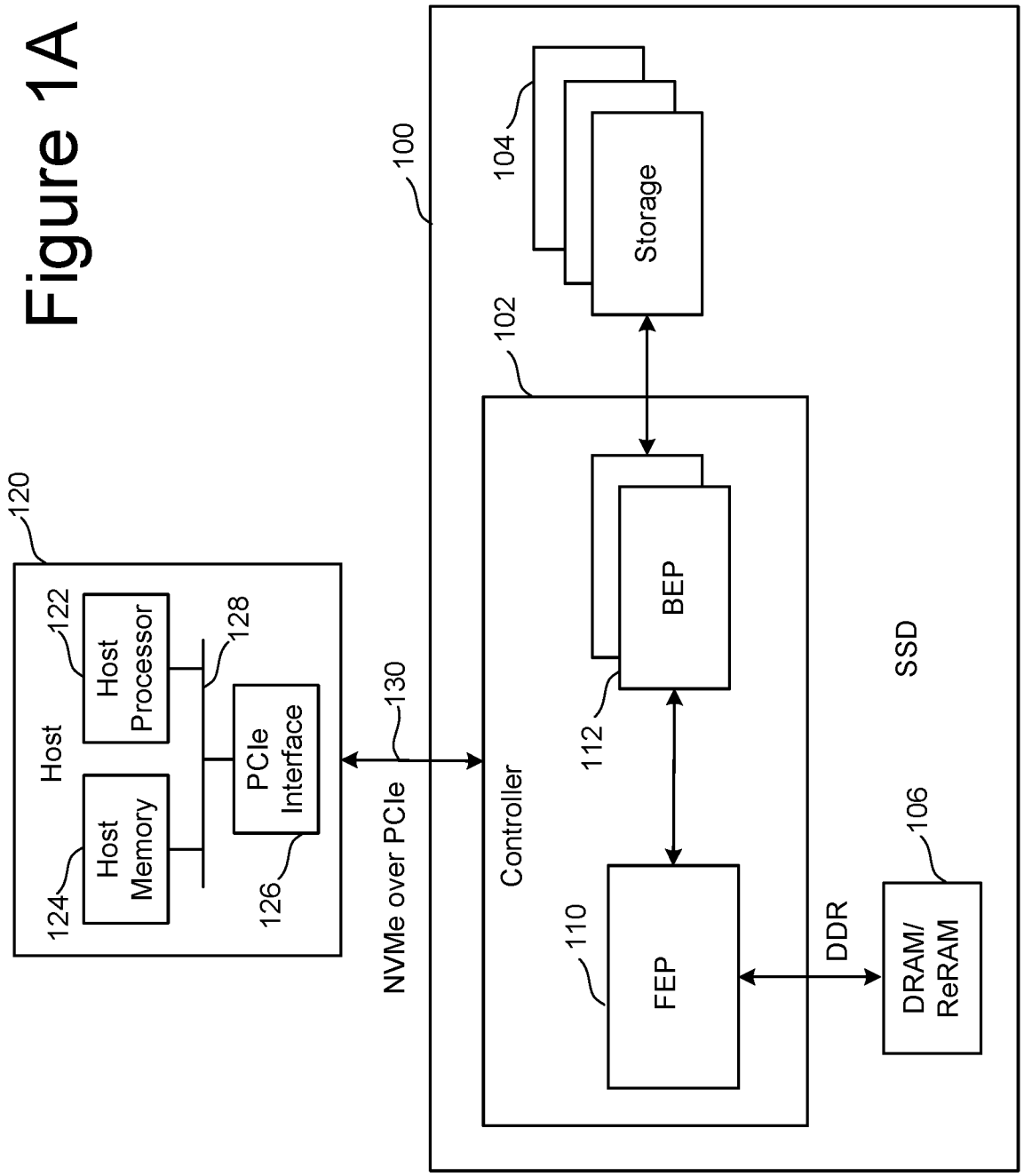
FIG. 1A is a block diagram of one embodiment of a storage system connected to a host.

Technology is disclosed herein for checking data integrity in non-volatile storage. In an embodiment, the storage system operates in a first mode in which a data integrity check is performed in closed blocks until more than an allowed number of word lines fail the data integrity check in a closed block. After a closed block has more than the allowed number of the word lines failing the data integrity check, then the storage system may operate in a second mode in which a data integrity check is performed in open blocks. The allowed number of word lines may be equal to the number of word lines that can be recovered by XOR data in the event data is uncorrectable by an ECC decoder. The data integrity check may use a variety of techniques to check the integrity of the data. For example, data integrity check may include reading a group of memory cells and determining a syndrome weight, bit error rate (BER), etc.

In an embodiment, the data integrity check in closed blocks checks only a subset of memory cells in the erase block, such as those connected to a subset of the word lines in the closed block. Herein, a "subset of memory cells" in an erase block means less than all of the memory cells in the erase block. Herein, a "subset of word lines" in an erase block means less than all of the word lines in the erase block. This subset could be those most likely to have data integrity issues based on, for example, statistical analysis. In an embodiment, the data integrity check in open blocks is referred to herein as a "rolling post-program data integrity check." In an embodiment the data integrity check in open blocks will check the data integrity of a susceptible word line after the next (neighbor) word line is programmed. In an embodiment, a susceptible word line is defined as a word line location that has previously failed at least once. The failure can be defined in a variety of ways including, but not limited to, a program failure or a read failure. If a word line at a certain location within a block fails in one block this may indicate that word lines at that location in other blocks are also susceptible to fail. Thus, in an embodiment, only a subset of the word lines (e.g., the susceptible word lines) in the open blocks are checked for data integrity in the rolling post-program data integrity check. In an embodiment, each word line in the subset is checked for data integrity only once in the rolling post-program data integrity check. In an embodiment, each iteration of the rolling post-program data integrity test will check a single word line for data integrity. For example, a word line that neighbors the most recently programmed word line may be tested for data integrity.

Testing the data integrity of only a subset of the memory cells (e.g., subset of the word lines) improves performance by avoiding unnecessary reads and unnecessary data integrity checks. By testing the integrity of data in closed blocks, data integrity issues that arise after the erase block is closed are detected. Moreover, in the event that the data integrity test of closed blocks indicates a relatively high failure rate, switching to testing of open blocks provides for early identification of data integrity issues.

In an embodiment, the list of word lines that are checked for data integrity may be changed in response to a program or read failure of a word line at that location in a closed or an open block. Adding a word line to the list of word lines to check for data integrity improves the accuracy of the data integrity checks. Therefore, a relatively small set of word lines can be checked for data integrity, which improves performance while still providing for sufficient data integrity checks to avoid data loss. As noted above, in an embodiment, each iteration of the rolling post-program data integrity checks a single word line for data integrity.

The proposed technology helps in detection of silent failures (e.g., a program status of pass but read gives high BER) in closed blocks. If the number of word lines showing these failures is more than that can be recovered through XOR, it can eventually lead to read failure. Detecting this issue after closing an erase block will give better reliability of closed blocks in the system.

FIG. 1A-FIG. 4E describe one example of a storage system that can be used to implement the technology proposed herein. FIG. 1A is a block diagram of one embodiment of a storage system 100 connected to a host 120. Storage system (e.g., non-volatile storage system) 100 can implement the technology proposed herein. The storage system 100 may perform embodiments of data integrity checks as described herein.

Many different types of storage systems can be used with the technology proposed herein. One example storage system is a solid state drive ("SSD"); however, other types of storage systems can also be used. Storage system 100 comprises a controller 102, storage 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, storage is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

Controller 102 communicates with host 120 via an interface 130 that implements NVM Express (NVMe) over PCI Express (PCIe). For working with storage system 100, host 120 includes a host processor 122, host memory 124, and a PCIe interface 126, all connected to a bus 128. Host memory 124 is the host's physical memory, and can be DRAM, SRAM, non-volatile memory or another type of storage. Host 120 is external to and separate from storage system 100. In one embodiment, storage system 100 is embedded in host 120.

Figure 1B:
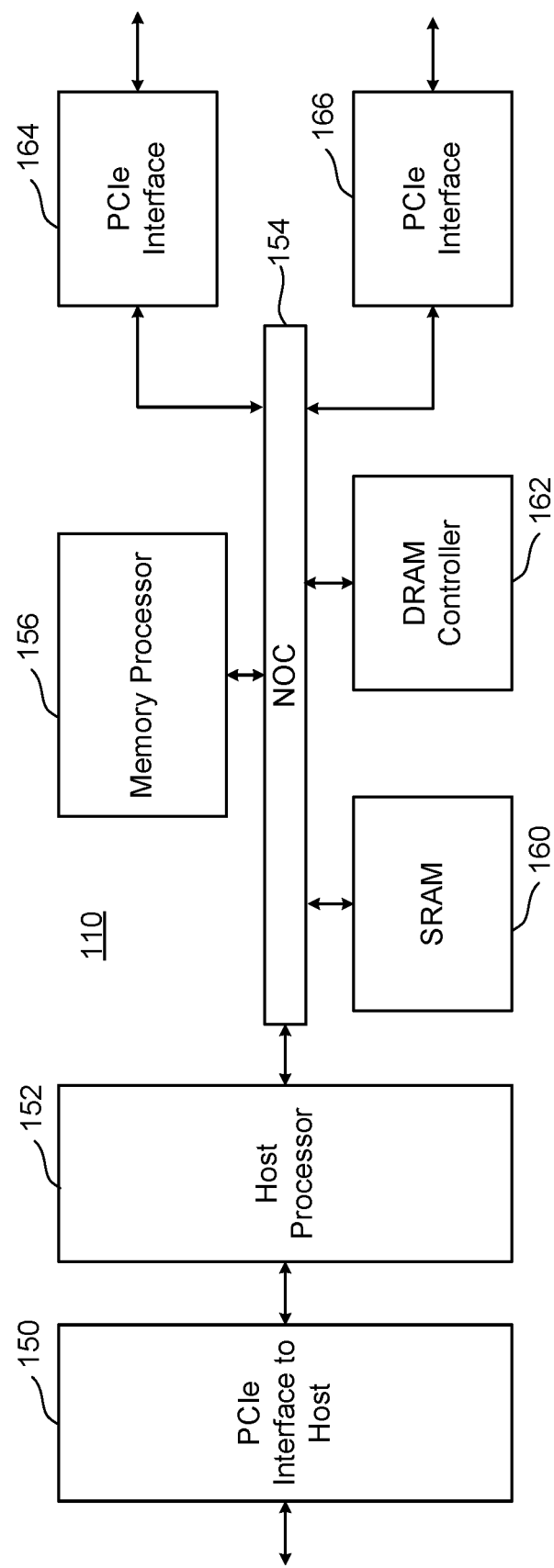
FIG. 1B is a block diagram of one embodiment of Front End Processor Circuit (FEP) of a memory controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2:
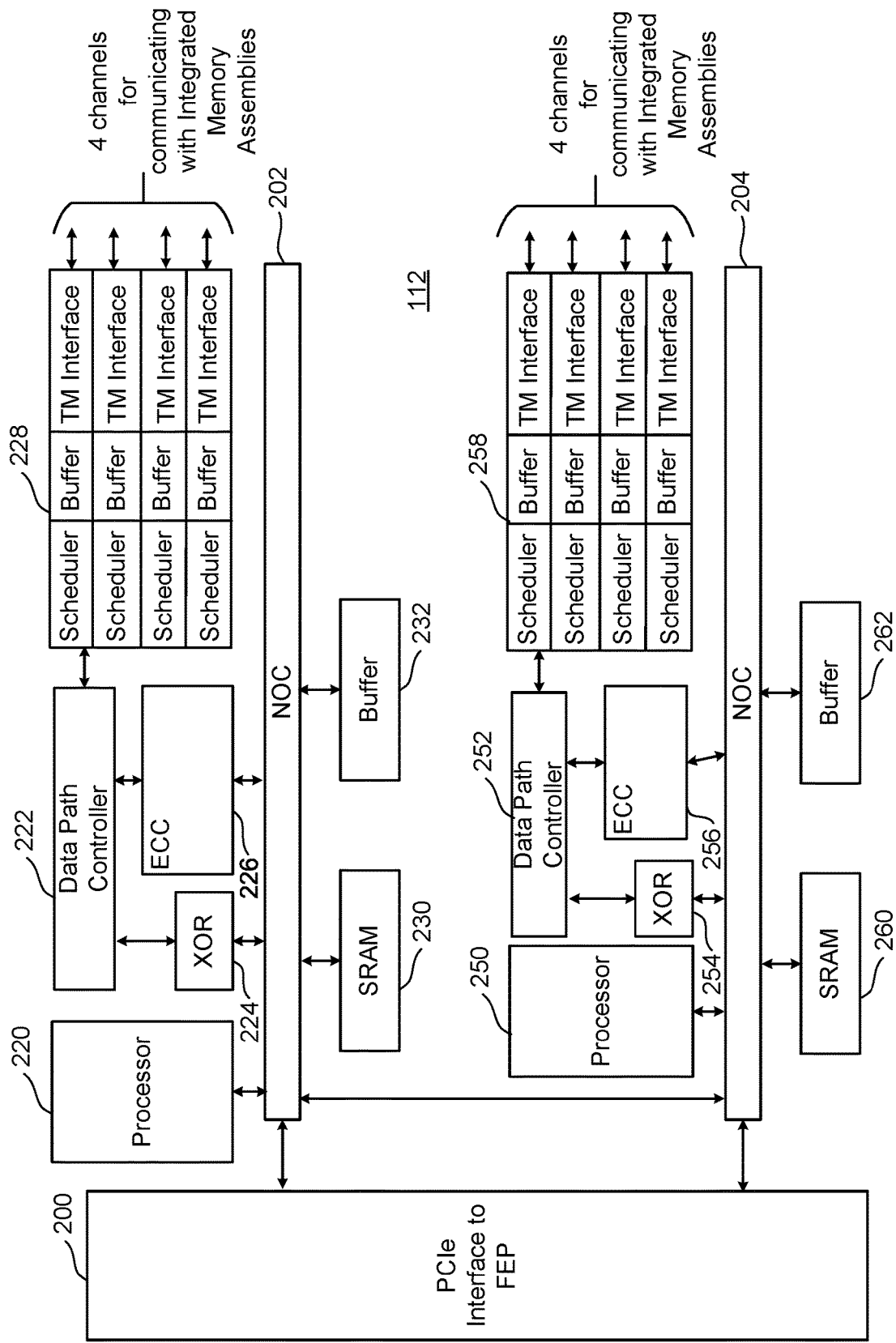
FIG. 2 is a block diagram of one embodiment of the Back End Processor Circuit (BEP) of a memory controller.

FIG. 2 is a block diagram of one embodiment of the BEP circuit 112. FIG. 2 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256). The ECC engines 226/256 are used to perform error correction, as known in the art.

The ECC engines 226/256 may encode data bytes received from the host, and may decode and error correct the data bytes read from the control die 304. In some embodiments, the ECC engines 226/256 calculate parity bits for each unit of data (e.g., page) that is being stored at one time. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page). The ECC engines 226/256 are configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof.

In an embodiment, the ECC engines 226/256 able to determine a syndrome weight for codewords read from the storage 104. In one embodiment, the syndrome weight refers to the number of parity check equations that are unsatisfied. The initial syndrome weight of a codeword may correlate with the bit error rate (BER) of that codeword. In one embodiment, the syndrome weight can be determined without fully decoding a codeword. In embodiments, the memory controller determines whether data read from a group of memory cells in storage 104 satisfies a data integrity criterion based on the BER, the syndrome weight, or another decoding metric.

The XOR engines 224/254 may be used to form redundancy information that is based on information from each codeword in a set of codewords. The redundancy information may be stored in one of the memory dies. This redundancy information may be used to recover the data bits for each of the codewords in the set of codewords. As one example, each codeword could be 4 kilobytes. Each codeword may be for one page of data, as one example. As one example, redundancy information may be formed from a bitwise XOR of each of the codewords. In one embodiment, the bitwise XOR has the same number of bits of each codeword. In one embodiment, the XOR data is updated for an erase block as each word line is programmed.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 may be dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2. Additionally, controllers with structures different than FIGS. 1B and 2 can also be used with the technology described herein.

Figure 3A:
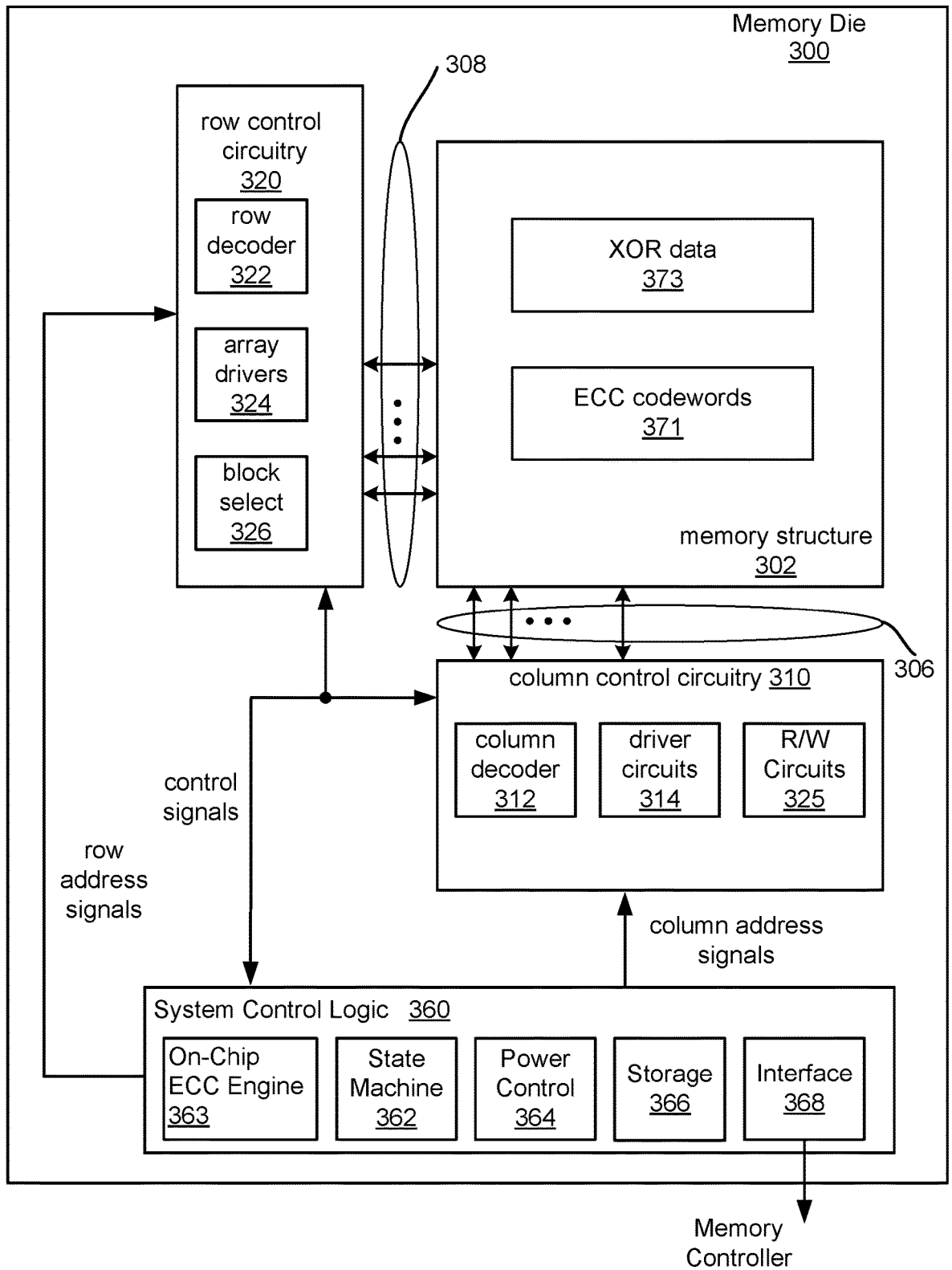
FIG. 3A is a block diagram of one embodiment of a memory die.

In one embodiment, non-volatile storage 104 comprises one or more memory dies. FIG. 3A is a functional block diagram of one embodiment of a memory die 300 that comprises non-volatile storage 104. Each of the one or more memory dies of non-volatile storage 104 can be implemented as memory die 300 of FIG. 3A. The components depicted in FIG. 3A are electrical circuits. Memory die 300 includes a memory structure 302 (e.g., memory array) that can comprise non-volatile memory cells (also referred to as non-volatile storage cells), as described in more detail below. The array terminal lines of memory structure 302 include the various layer(s) of word lines organized as rows, and the various layer(s) of bit lines organized as columns. However, other orientations can also be implemented. Memory die 300 includes row control circuitry 320, whose outputs are connected to respective word lines of the memory structure 302. Row control circuitry 320 receives a group of M row address signals and one or more various control signals from System Control Logic circuit 360, and typically may include such circuits as row decoders 322, array drivers 324, and block select circuitry 326 for both reading and writing (programming) operations. Row control circuitry 320 may also include read/write circuitry. Memory die 300 also includes column control circuitry 310 including read/write circuits 325. The read/write circuits 325 may contain sense amplifiers and data latches. The sense amplifier(s) input/outputs are connected to respective bit lines of the memory structure 302. Although only a single block is shown for structure 302, a memory die can include multiple arrays that can be individually accessed. Column control circuitry 310 receives a group of N column address signals and one or more various control signals from System Control Logic 360, and typically may include such circuits as column decoders 312, array terminal receivers or driver circuits 314, as well as read/write circuitry 325, and I/O multiplexers. The memory cells in the memory structure 302 may store ECC codewords 371. The ECC codewords 371 may be decoded by an ECC decoder. Some of the memory cells in the memory structure 302 may store XOR data 373. In the event that one or more ECC codewords 371 cannot be decoded, then XOR data 373 may be used to recover the data represented by the undecodable ECC codewords 371.

System control logic 360 receives data and commands from memory controller 102 and provides output data and status to the host. In some embodiments, the system control logic 360 (which comprises one or more electrical circuits) includes state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. System control logic 360 can also include a power control module 364 that controls the power and voltages supplied to the rows and columns of the memory structure 302 during memory operations. System control logic 360 includes storage 366 (e.g., RAM, registers, latches, etc.), which may be used to store parameters for operating the memory structure 302.

The On-Chip ECC engine 363 may encode data received from the memory controller 102 and may decode and error correct the data read from the memory structure 302. The On-Chip ECC engine 363 is configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof. In an embodiment, the On-Chip ECC engine 363 is able to determine a syndrome weight for codewords read from the memory structure 302. In embodiments, the On-Chip ECC engine 363 determines whether data read from a group of memory cells in memory structure 302 satisfies a data integrity criterion based on the BER, the syndrome weight, or another decoding metric.

Commands and data are transferred between memory controller 102 and memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used.

In some embodiments, all the elements of memory die 300, including the system control logic 360, can be formed as part of a single die. In other embodiments, some or all of the system control logic 360 can be formed on a different die than the die that contains the memory structure 302.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts: (1) memory structure 302 and (2) peripheral circuitry, which includes all of the other components depicted in FIG. 3A. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 3A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 3B:
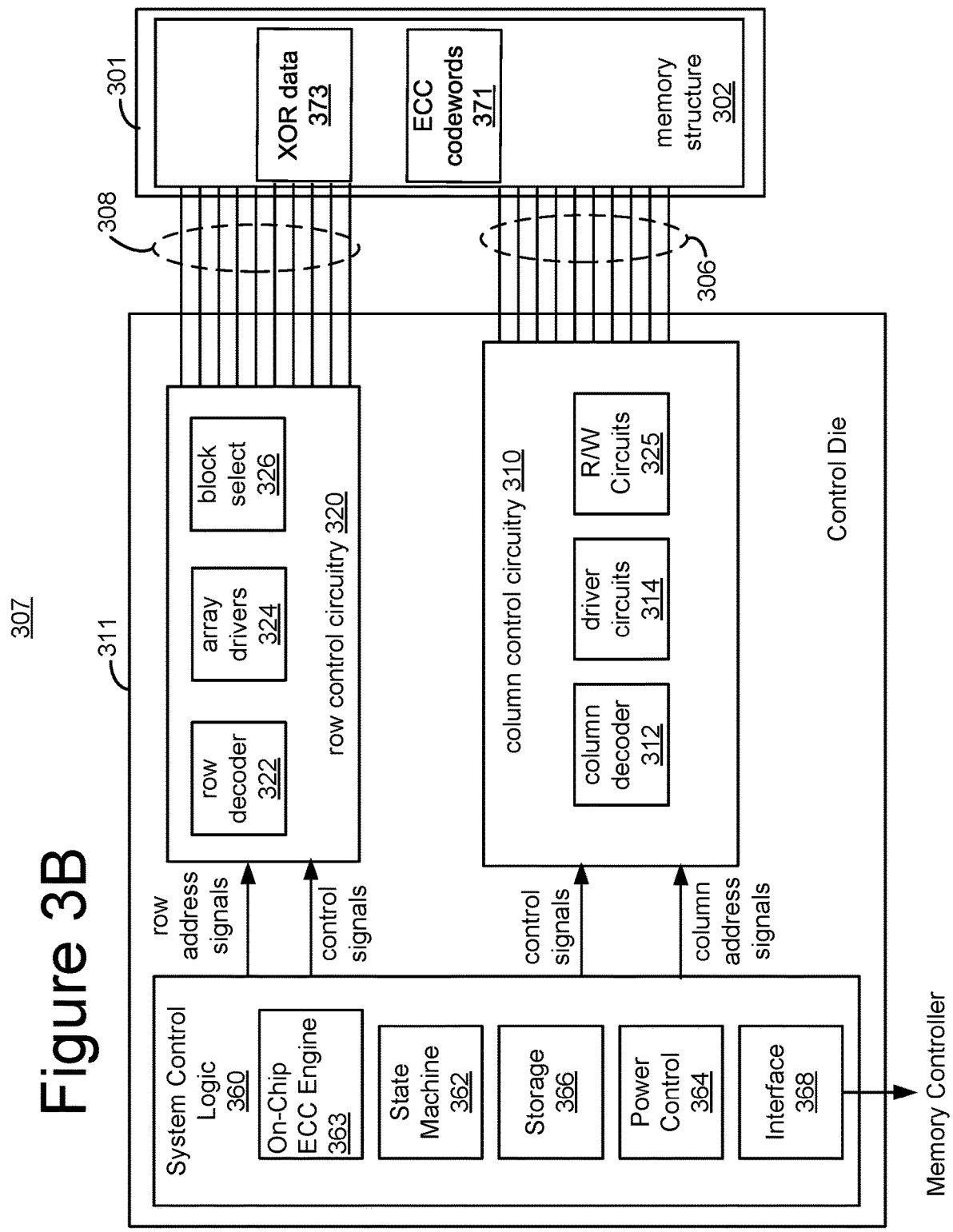
FIG. 3B is a block diagram of one embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. One or more integrated memory assemblies 307 may be used to implement the non-volatile storage 104 of storage system 100. The integrated memory assembly 307 includes two types of semiconductor dies (or more succinctly, "die"). Memory structure die 301 includes memory structure 302. Memory structure 302 includes non-volatile memory cells. Control die 311 includes control circuitry 360, 310, and 320 (as described above). In some embodiments, control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require many additional process steps. The control die 311 could also be referred to as a CMOS die, due to the use of CMOS technology to implement some or all of control circuitry 360, 310, 320.

FIG. 3B shows column control circuitry 310 including read/write circuits 325 on the control die 311 coupled to memory structure 302 on the memory structure die 301 through electrical paths 306. For example, electrical paths 306 may provide electrical connection between column decoder 312, driver circuitry 314, and R/W circuits 325 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each electrical path 308 may correspond to a word line, dummy word line, or select gate line. Additional electrical paths may also be provided between control die 311 and memory structure die 301.

For purposes of this document, the phrases "a control circuit" or "one or more control circuits" can include, but is not limited to, any one of or any combination of all or a portion of memory controller 102, ECC engine 226/256, XOR 224/254, state machine 362, power control 364, On-chip ECC engine 363, all or a portion of system control logic 360, all or a portion of row control circuitry 320, all or a portion of column control circuitry 310, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 104, memory die 300, integrated memory assembly 307, and/or control die 311.

Figure 3C:
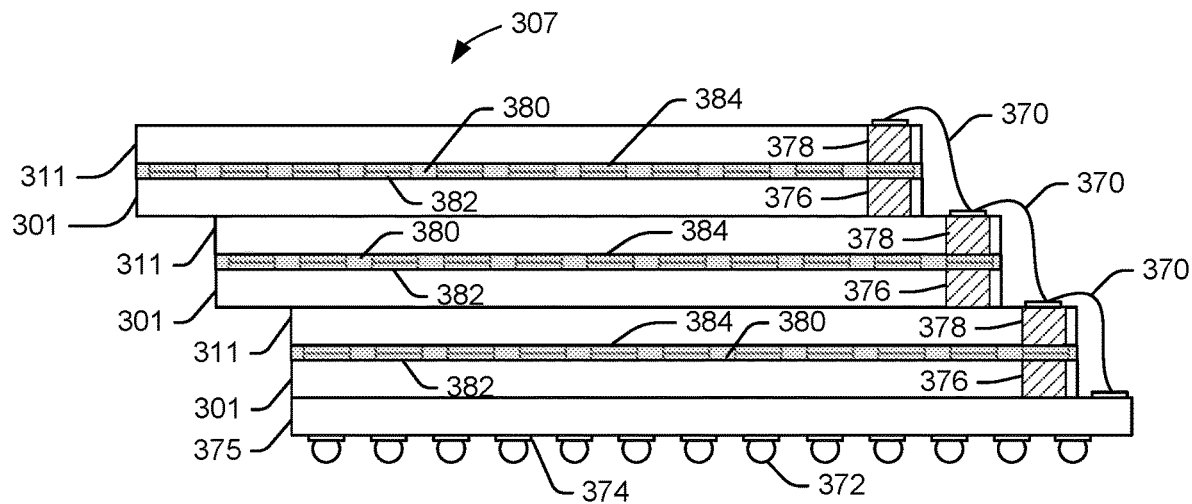
FIGS. 3C and 3D depict different embodiments of integrated memory assemblies.

In some embodiments, there is more than one control die 311 and more than one memory structure die 301 in an integrated memory assembly 307. In some embodiments, the integrated memory assembly 307 includes a stack of multiple control dies 311 and multiple memory structure dies 301. FIG. 3C depicts a side view of an embodiment of an integrated memory assembly 307 stacked on a substrate 375 (e.g., a stack comprising control die 311 and memory structure die). The integrated memory assembly 307 has three control dies 311 and three memory structure dies 301. In some embodiments, there are more than three memory structure dies 301 and more than three control dies 311. In FIG. 3A there are an equal number of memory structure dies 301 and control dies 311; however, in one embodiment, there are more memory structure dies 301 than control dies 311. For example, one control die 311 could control multiple memory structure dies 301.

Each control die 311 is affixed (e.g., bonded) to at least one of the memory structure die 301. Some of the bond pads 382/284 are depicted. There may be many more bond pads. A space between two die 301, 311 that are bonded together is filled with a solid layer 380, which may be formed from epoxy or other resin or polymer. This solid layer 380 protects the electrical connections between the die 301, 311, and further secures the die together. Various materials may be used as solid layer 380, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 370 connected to the bond pads connect the control die 311 to the substrate 375. A number of such wire bonds may be formed across the width of each control die 311 (i.e., into the page of FIG. 3A).

A memory die through silicon via (TSV) 376 may be used to route signals through a memory structure die 301. A control die through silicon via (TSV) 378 may be used to route signals through a control die 311. The TSVs 376, 378 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 372 may optionally be affixed to contact pads 374 on a lower surface of substrate 375. The solder balls 372 may be used to couple the integrated memory assembly 307 electrically and mechanically to a host device such as a printed circuit board. Solder balls 372 may be omitted where the integrated memory assembly 307 is to be used as an LGA package. The solder balls 372 may form a part of the interface between integrated memory assembly 307 and memory controller 102.

Figure 3D:
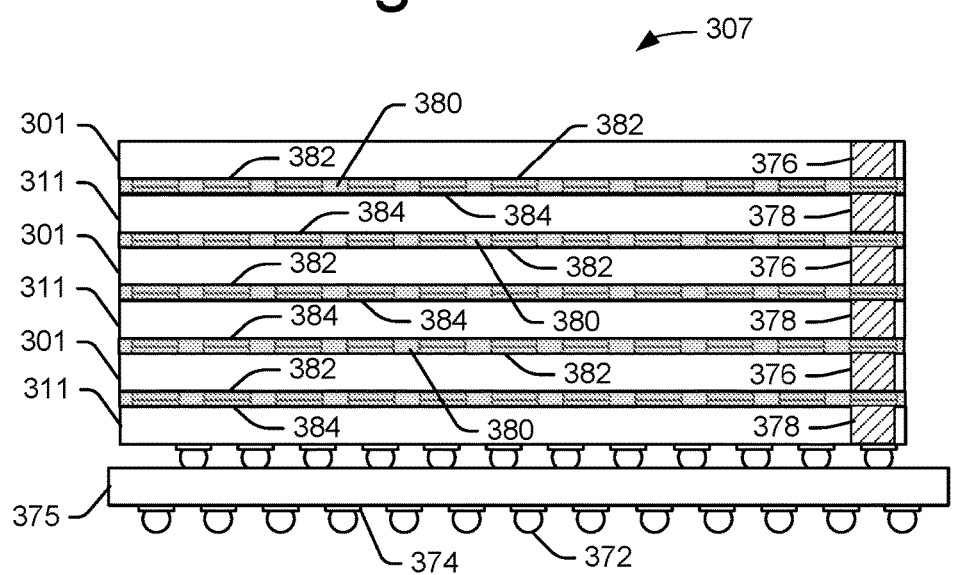

FIG. 3D depicts a side view of another embodiment of an integrated memory assembly 307 stacked on a substrate 375. The integrated memory assembly 307 of FIG. 3D has three control dies 311 and three memory structure dies 301. In some embodiments, there are many more than three memory structure dies 301 and many more than three control dies 311. In this example, each control die 311 is bonded to at least one memory structure die 301. Optionally, a control die 311 may be bonded to two or more memory structure dies 301.

Some of the bond pads 382, 384 are depicted. There may be many more bond pads. A space between two dies 301, 311 that are bonded together is filled with a solid layer 380, which may be formed from epoxy or other resin or polymer. In contrast to the example in FIG. 3A, the integrated memory assembly 307 in FIG. 3D does not have a stepped offset. A memory die through silicon via (TSV) 376 may be used to route signals through a memory structure die 301. A control die through silicon via (TSV) 378 may be used to route signals through a control die 311.

Solder balls 372 may optionally be affixed to contact pads 374 on a lower surface of substrate 375. The solder balls 372 may be used to couple the integrated memory assembly 307 electrically and mechanically to a host device such as a printed circuit board. Solder balls 372 may be omitted where the integrated memory assembly 307 is to be used as an LGA package.

As has been briefly discussed above, the control die 311 and the memory structure die 301 may be bonded together. Bond pads on each die 301, 311 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 301, 311. Where no such film is initially provided, a space between the die may be under filled with an epoxy or other resin or polymer. The under-fill material may be applied as a liquid which then hardens into a solid layer. This under-fill step protects the electrical connections between the dies 301, 311, and further secures the die together. Various materials may be used as under-fill material.

Figure 4:
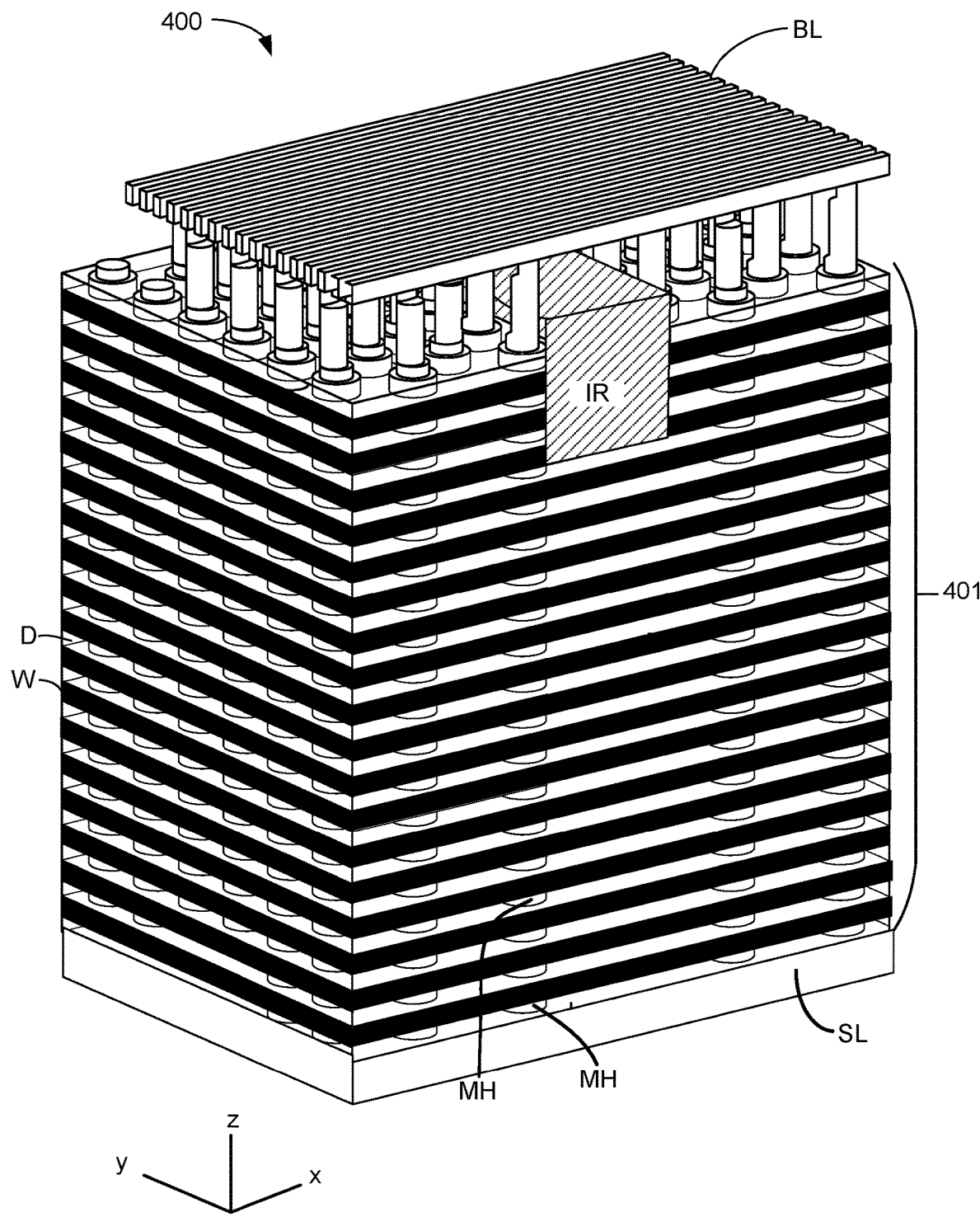
FIG. 4 is a perspective view of a portion of one example of a monolithic three dimensional memory structure.

FIG. 4 is a perspective view of a portion of one example of a monolithic three dimensional memory array/structure that can comprise memory structure 302, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 302 is provided below.

Figure 4A:
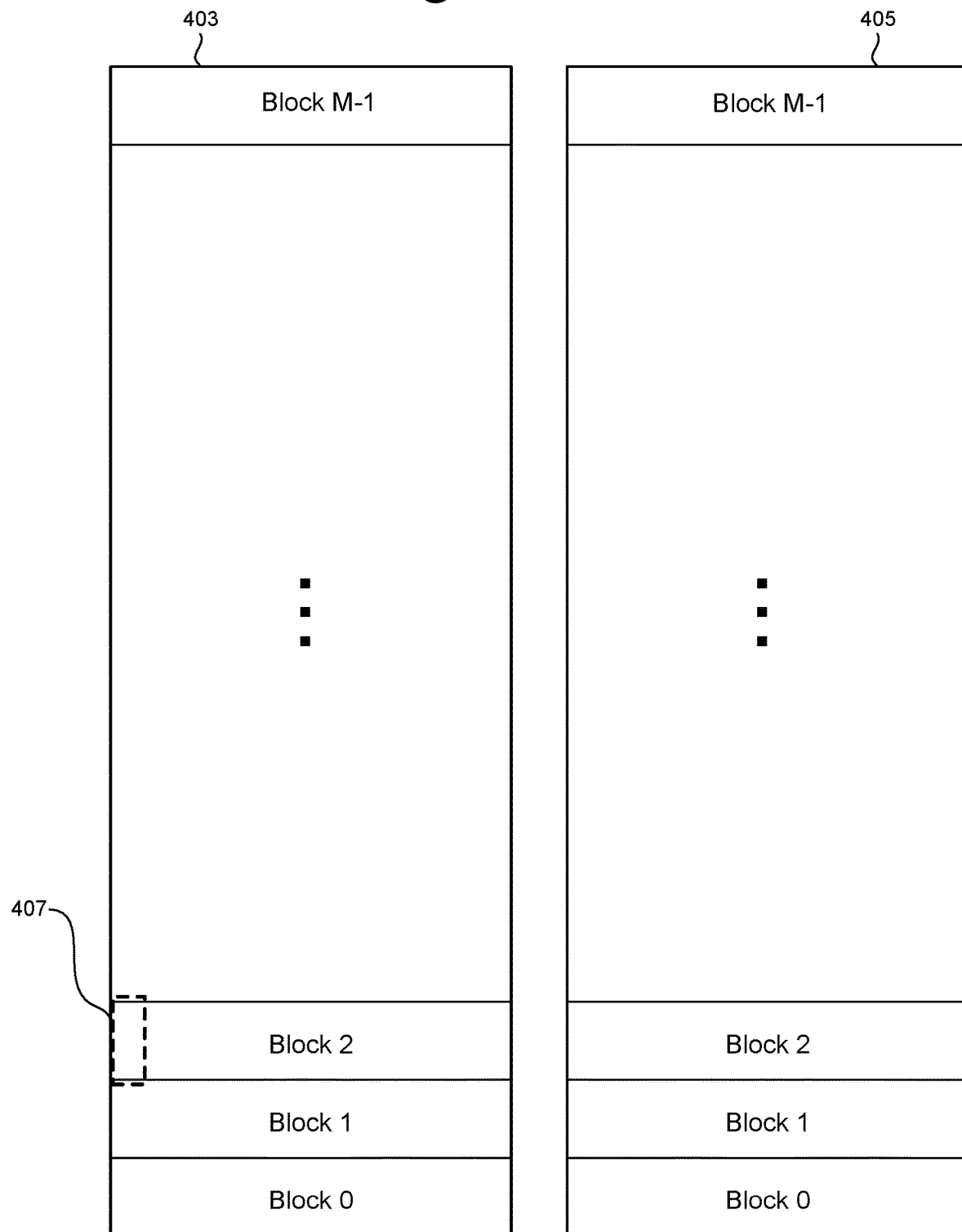
FIG. 4A is a block diagram of one example of a memory structure having two planes.

FIG. 4A is a block diagram explaining one example organization of memory structure 302, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Such sub-blocks that are the unit of erase are referred to herein as erase blocks. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 302 includes four planes. In some embodiments, memory structure 302 includes eight planes. In some embodiments, programming can be performed in parallel in a first selected block in plane 403 and a second selected block in plane 405.

FIGS. 4B-4E depict an example three dimensional ("3D") NAND structure that corresponds to the structure of FIG. 4 and can be used to implement memory structure 302 of FIGS. 3A and 3B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
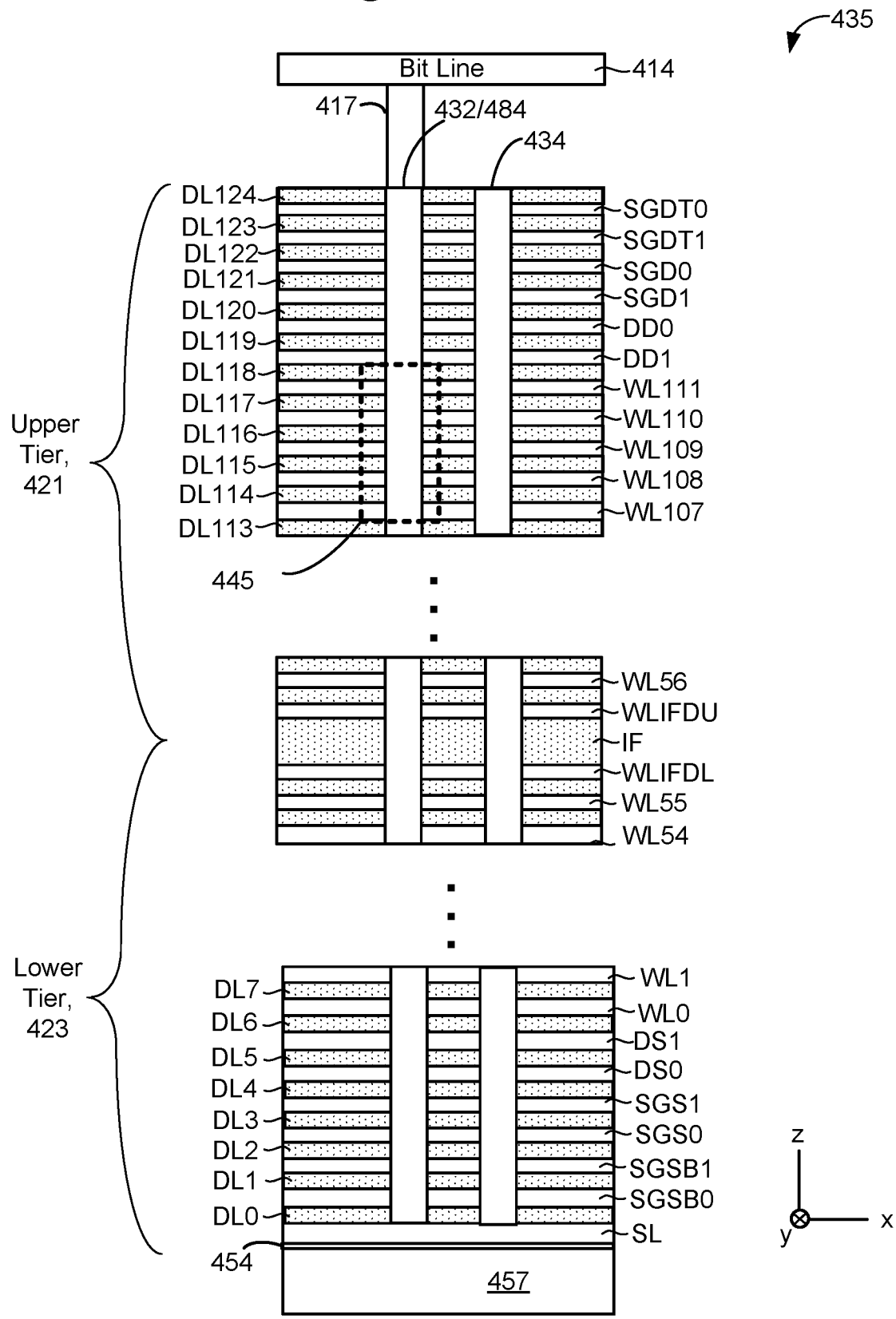
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Figure 4D:
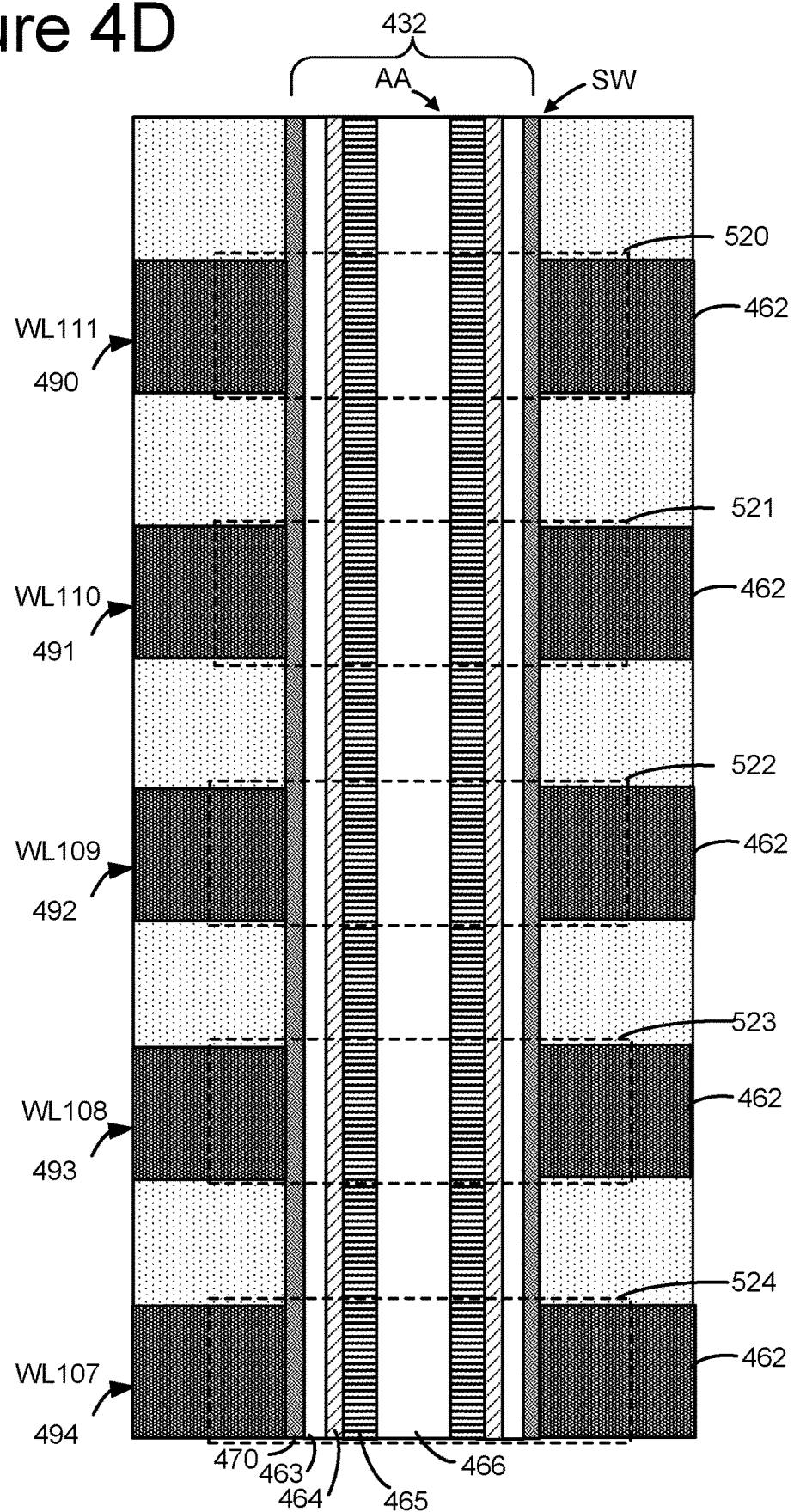
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
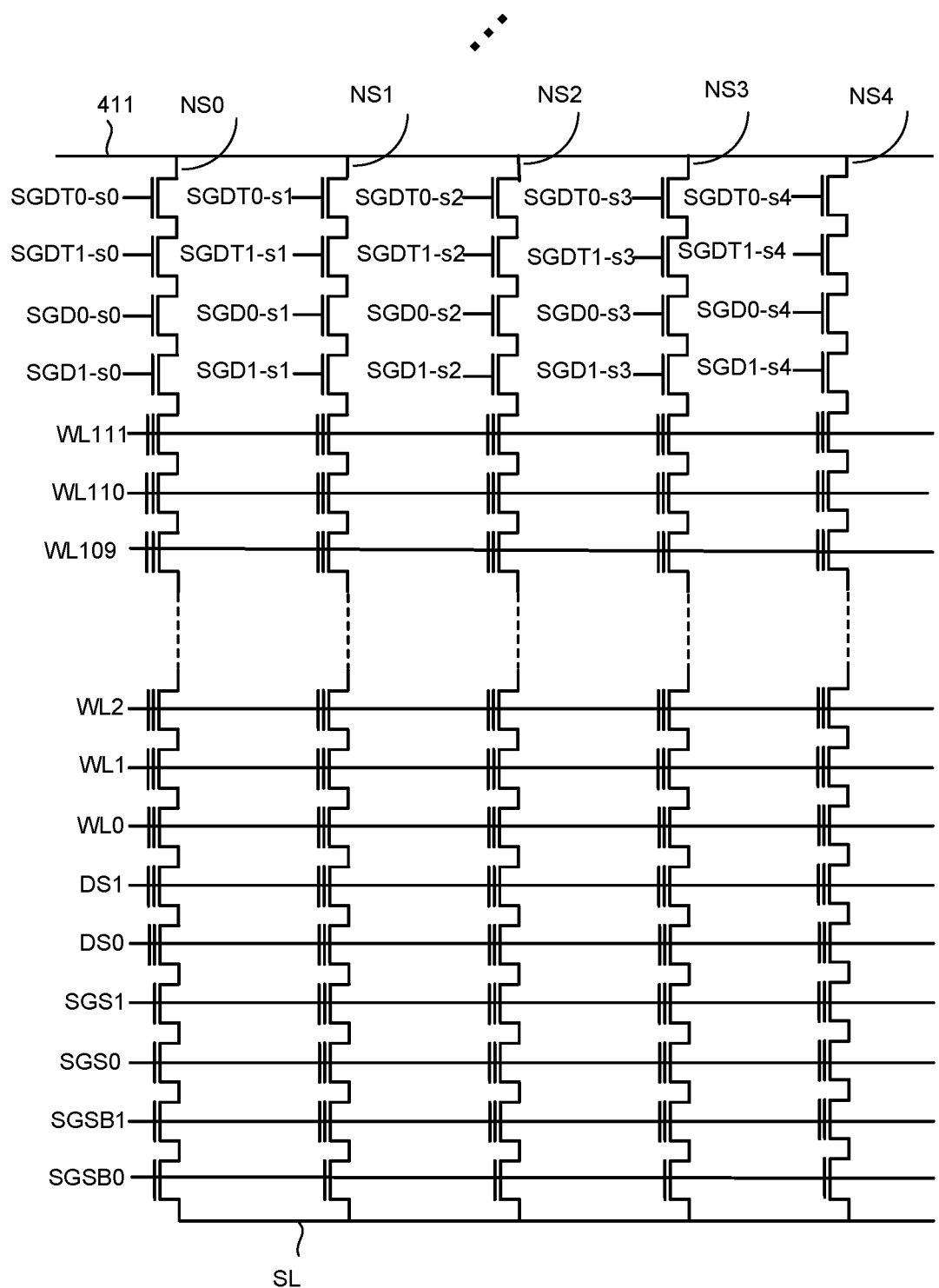
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. A fifth sub-block corresponds to those vertical NAND strings controlled by SGDT0-s4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL55 may be in the lower tier 423 and memory cells connected to WL56-WL111 may be in the upper tier 421. Hence, memory cells connected to WL0-WL55 may be in one erase block and memory cells connected to WL56-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other 3D memory structures can also be used with the technology described herein.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A illustrates example threshold voltage distributions for the memory array when each memory cell stores three bits of data. Other embodiments, however, may use other data capacities per memory cell (e.g., such as one, two, four, or five bits of data per memory cell). FIG. 5A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, ...) a memory cell is in.

FIG. 5A also shows seven verify reference voltages, VvA, VvB, VvC. VVD, VVE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 5A represent the full sequence programming. In some embodiments, data states A-G can overlap, with error correction being used identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a set of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VIC, VrD, VrE, VrF, and VrG, of FIG. 5A) or verify operation (e.g. see verify target levels VvA, VvB, VvC. VVD, VvE, VvF, and VvG of FIG. 5A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5B depicts threshold voltage distributions and one page mapping scheme when each memory cell stores four bits of data. FIG. 5B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding (with, for example, ECC engine 226/256 or On-Chip ECC engine 363) impossible.

As noted, FIG. 5B depicts an example in which four bits are stored per memory cell. Thus, four pages may be stored in a set of memory cells. Fifteen hard bit (HB) read reference levels are depicted (Vr1-Vr15). The set of memory cells may be connected to the same word line. Each HB read reference levels is used to distinguish between two adjacent threshold voltage distributions. Stated another way, each HB read reference levels is used to distinguish between two adjacent data states. For example, HB read reference level Vr4 is used to distinguish between data states S3 and S4.

FIG. 5B also depicts soft bit (SB) reference levels associated with four of the HB reference levels. Those four HB reference levels may be those used to sense one page of data. There is one set of SB reference levels grouped around each of Vr1, Vr4, Vr6, and Vr11. For example, the set of SB reference levels Vr1_s1, Vr1_s2, Vr1_s3, and Vr1_s4 are grouped around HB reference level Vr1; the set of SB reference levels Vr4_s1, Vr4_s2, Vr4_s3, and Vr4_s4 are grouped around HB reference level Vr4; the set of SB reference levels Vr6_s1. Vr6_s2, Vr6_s3, and Vr6_s4 are grouped around HB reference level Vr6; and the set of SB reference levels Vr11_s1, Vr11_s2, Vr11_s3, and Vr11_s4 are grouped around HB reference level Vr11. There may be SB reference levels associated with the other HB reference levels, but they are not depicted in FIG. 5B. In FIG. 5B, there are four SB reference levels associated with each corresponding HB reference level, but there could be more or fewer SB reference levels associated with a HB reference level. In FIG. 5B there are an equal number of SB reference levels on each side of a corresponding HB reference level, but this is not a requirement. For example, sensing at a SB reference level on just one side of the corresponding HB reference level can provide useful reliability information.

In some embodiments, the SB reference voltages are used to read data in the memory cells when the ECC engine 226/256 (or On-Chip ECC engine 363) is not able to decode a codeword stored in the memory cells using data sensed using the HB reference voltages. Typically, there is a set of SB reference voltages for each HB reference voltage.

The set of SB reference voltages are used to generate "soft" reliability information, which increases the correction capability of the ECC decoder. Sensing at the SB reference voltages generates one or more "soft bits" for each memory cell, which indicate whether the physical parameter (e.g., Vt) of a memory cell close to the HB reference level making the HB for that memory cell less reliable, or far from the HB reference level making the HB more reliable. In other words, if the soft reliability information indicates that a memory cell has its value for a physical parameter close to the HB reference level, then this is considered less reliable than if the soft reliability information indicates that a memory cell has its value for a physical parameter far from the HB reference level.

Prior to programming a group of memory cells that group is erased. The erase process will typically erase a large group of memory cells. Thus, the group that is erased may contain a large group of memory cells that contains many physical pages of memory cells. In in embodiment, an entire physical block of memory cells are erased together. However, in some cases only a portion of the physical block of memory cells are erased together. For example, only the upper tier 421 of the block or only the lower tier 423 of the block might be erased in the erase operation.

Figure 6:
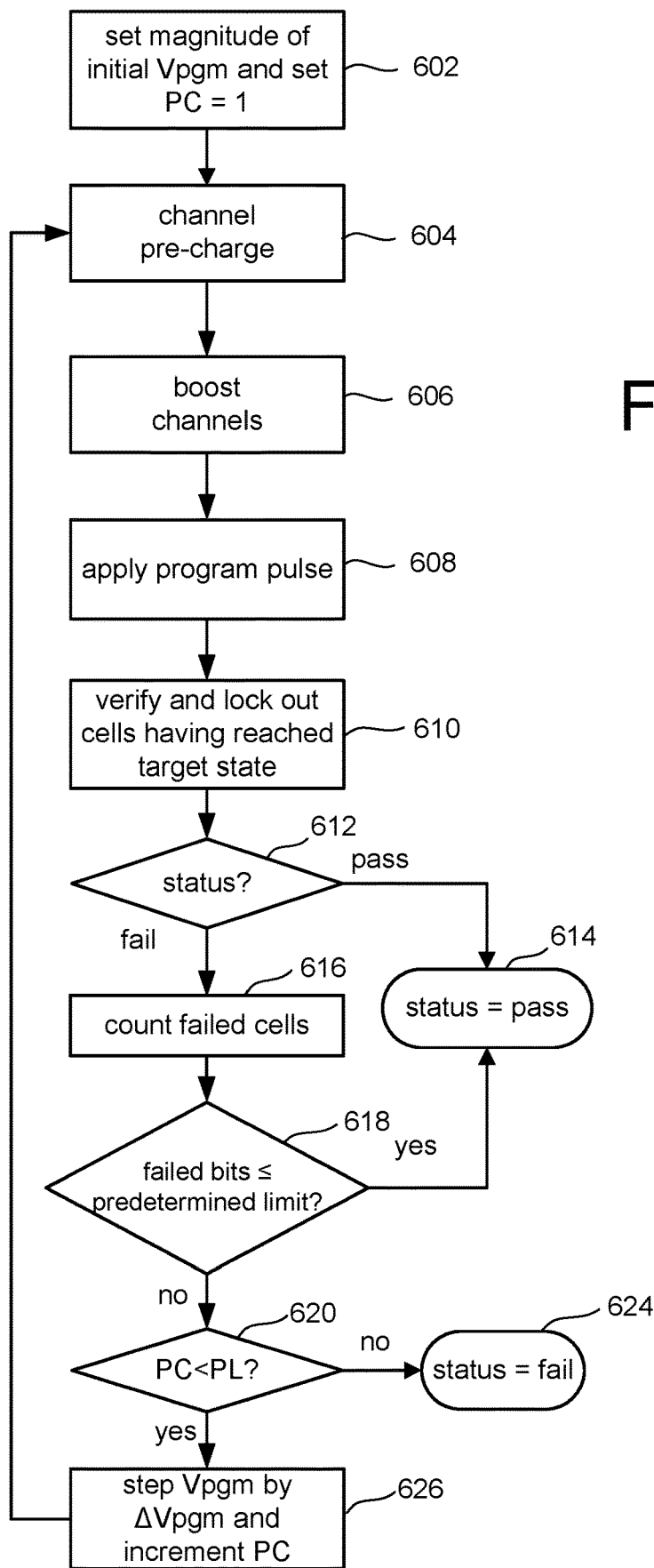
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 302 using the one or more control circuits (e.g., system control logic 360, column control circuitry 310, row control circuitry 320) discussed above. In one example embodiment, the process of FIG. 6 is performed by integrated memory assembly 307 using the one or more control circuits (e.g., system control logic 360, column control circuitry 310, row control circuitry 320) of control die 311 to program memory cells on memory structure die 301. The process includes multiple loops, each of which includes a program phase and a verify phase.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the system will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming. Step 610 includes performing verification of programming by sensing at one or more verify reference levels. In one embodiment, the verification process is performed by testing whether the threshold voltages of the memory cells selected for programming have reached the appropriate verify reference voltage. In some embodiments, the magnitude of the verify reference voltages will depend on whether programming will result in an open block. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 102, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Figure 7:
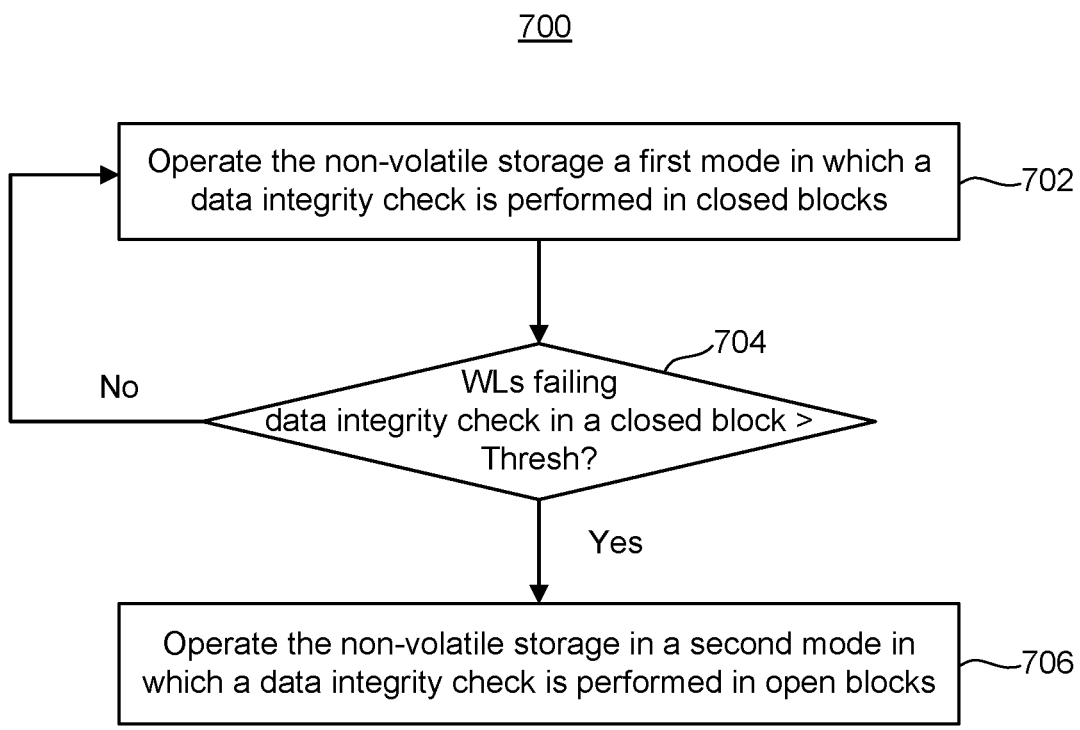
FIG. 7 is a flowchart of one embodiment of a process of performing data integrity checks in non-volatile storage.

In some embodiments, the storage system is operating in two data integrity modes. Operating in the two data integrity modes provides high performance and early detection of data integrity issues in response to data integrity issues arising in closed blocks. FIG. 7 is a flowchart of one embodiment of a process 700 of performing data integrity checks in non-volatile storage. The process 700 may be performed by, but is not limited to, a combination of one or more of memory controller 102, system control logic 360, column control circuitry 310, and/or row control circuitry 320.

Step 702 includes operating the non-volatile storage 100 in a first data integrity mode in which a data integrity check is performed in closed blocks. In an embodiment, the same subset of word lines are tested in each closed block. This subset may include word lines that are expected to have a high BER. When operating in the first data integrity mode, in the event that the data integrity check fails, the storage system 100 may move that data to another location in an open block. When operating in the first data integrity mode, in the event that there is a failure of the ECC decoder to decode one or more units of data in a closed block, the storage system 100 may recover that data using XOR data. Note, however, that there may be a limit to how many units of data in a closed block can be recovered with the XOR data for that closed block.

Step 704 includes a determination of whether the number of WLs failing the data integrity check in a closed block are greater than a threshold. In an embodiment, the threshold is whether XOR recovery will be able to recover the data in the WLs that failed the data integrity test. Providing that the number of WLs failing the data integrity check is not greater than the threshold, the storage system stays in the first mode (step 702 continues to be performed on different closed blocks). However, in the event that the number of WLs in a closed block failing the data integrity check is greater than the threshold, the storage system switches to a second data integrity mode (step 706).

Step 706 includes operating the non-volatile storage 100 in the second data integrity mode in which a data integrity check is performed in open blocks. The open block data integrity test may be referred to herein as "rolling error detection." In an embodiment, the same set of word lines are tested in second mode for the open blocks that were tested in the first mode for the closed blocks. Note that the data integrity check of step 706 is not performed in step 702.

In an embodiment of step 706. WLx is tested for data integrity after WLx+1 is programmed. Note that WLx is one of the WLs to be tested and WLx+1 is the WL that is programmed after WLx. Also, WLx+1 is adjacent to WLx or, in other words, WLx+1 is an immediate neighbor to WLx. When operating in the second data integrity mode, in the event that the data integrity check fails, the storage system 100 may move that data to another location either within the open block or in another open block. When operating in the second data integrity mode, in the event that there is a failure of the ECC decoder to decode data during the data integrity check, the storage system 100 may recover that data using XOR data for the open block.

Figure 8:
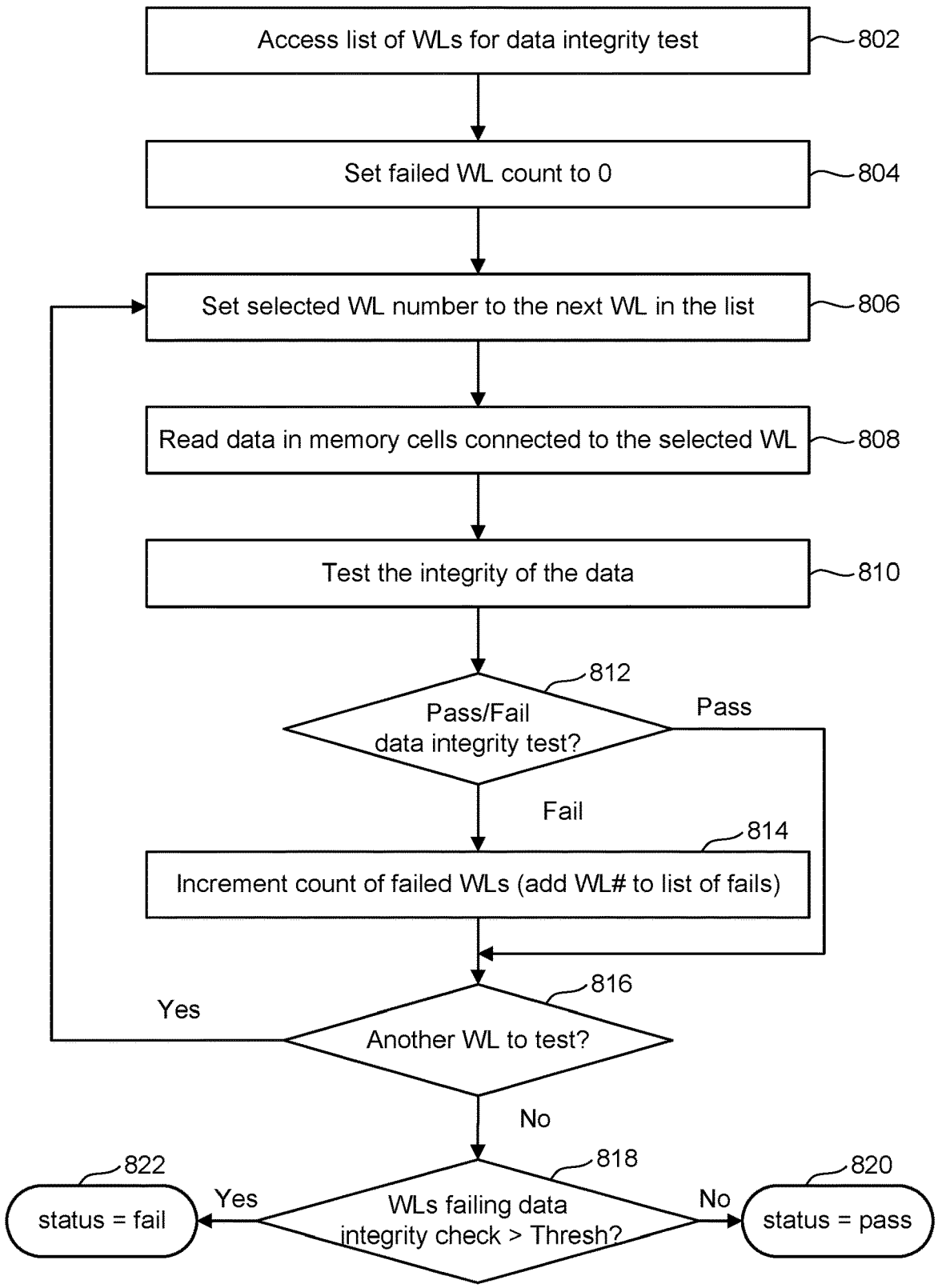
FIG. 8 is a flowchart of one embodiment of a process of performing a data integrity check in a closed block.

FIG. 8 is a flowchart of one embodiment of a process 800 of performing a data integrity check in a closed block. The process 800 may be performed by, but is not limited to, a combination of one or more of memory controller 102, system control logic 360, control circuitry 310, and/or row control circuitry 320. The process 800 may be performed at any time after the block is closed. The process 800 may be performed more than once on the same closed block in order to continues to test the data integrity at different times. The process 800 may be performed independent of a request to read user data. In one embodiment, the memory controller 102 determines what closed blocks to test and when to test those closed blocks. Thus, process 800 may be initiated by the memory controller 102. Steps 802-816 of process 800 may be performed in one embodiment of step 702 in FIG. 7. Steps 818-822 of process 800 may be performed in one embodiment of step 704 in FIG. 7.

Step 802 includes accessing a list of word lines for a data integrity test. This list defines what memory cells in closed block will be tested for data integrity. In an embodiment, the closed block corresponds to an erase block, which may be all or a portion of a physical block. For example, if the physical block is programmed and erased as separate tiers (e.g., upper tier 421, lower tier 423 in FIG. 4C), then the closed block may correspond to only the upper tier 421 or only the lower tier 423. The list of word lines for the data integrity test may be stored anywhere in the storage system 100. In one embodiment, a copy of the list is stored in the memory structure 302. For example, a portion of the memory structure 302 may be used to store operating parameters, with the list being among the operating parameters. The list may be copied to storage 366 when the memory die 300 is powered on. However, the list may be stored elsewhere in the storage system 100. In one embodiment, the list of word lines may be altered over time to add more word lines to test for data integrity. Factors that may be used to add word lines to the list include, but are not limited to, a program failure and a read failure. Further details of adding word lines to the list are discussed below.

Referring to FIG. 9, an example table 900 of word lines to test in a closed block is depicted. In this example, there are 32 word lines (WL0 to WL31) in the closed block, but there may be more or fewer than 32 word lines in a closed block. The table 900 indicates a program/erase (P/E) status for each word line, which is programmed (PGM) for all word lines for this closed block. Word lines WL8, WL18, and WL26 are to be tested for data integrity (TEST). The other word lines will not be tested for data integrity (DNT or Do Not Test). Step 804 in FIG. 8 includes setting a failed word line count to zero. This count will track the number of word lines in this closed block that fail the data integrity test.

Step 806 includes setting the selected word line number to the next word line in the list. The selected word line refers to the word line to be tested for data integrity. Step 808 includes reading data in memory cells connected to the selected word line. Step 808 is not required to read every memory cell connected to the selected word line, but that is one possibility. In an embodiment, the memory cells are read at hard bit reference levels. The data may be stored in the memory cells as one or more ECC codewords. Typically, there will be multiple ECC codewords stored in the memory cells connected to one word line. At least one ECC codeword is read in step 808.

Step 810 includes testing the integrity of the data that was read on step 808. In one embodiment, the data is transferred from the memory die to the memory controller 102, which uses the ECC engine 226/256 to decode the one or more ECC codewords. However, the On-Chip ECC engine 363 is used in one embodiment. The term "ECC decoder" may refer to, but is not limited to, ECC engine 226/256 in memory controller 102 or On-Chip ECC engine 363. In one embodiment, the ECC decoder determines a syndrome weight of an ECC codeword. In one embodiment, the ECC decoder determines a BER for the data. The BER may be, for example, the number of bits in error per some unit (size) of data. The data integrity may be judged based on the syndrome weight, BER or some other decoding metric. As one example, the data integrity test passes if the BER is below some threshold BER. As another example, the data integrity test passes if the syndrome weight is below some threshold syndrome weight.

Step 812 includes a determination of whether the data integrity test passed. If the data integrity test failed, then the total number of failed word lines is incremented in step 814. Also, the word line number may be added to a list of failed word lines for this block (this is a different list from the list of word lines to be tested for data integrity). After step 814 step 816 is performed. If the data integrity test passes, then step 814 is skipped. Step 816 includes a determination of whether there are more word lines to test in this closed block. If so, then in step 806 the next word line in the list is selected for test.

When all the word lines in the list are tested for this closed block a determination is made in step 818 of whether the total number of word lines failing the data integrity test exceeds a threshold. In one embodiment, the threshold corresponds to the number of word lines whose data could be recovered using an XOR recovery process. The XOR recovery process may be used in the event that the ECC decoder is unable to decode one or more of the ECC codewords stored in the cells connected to a word line. If the number of word lines failing the data integrity test does not exceed the threshold, then the process concludes in step 820 with a status of pass. If the number of word lines failing the data integrity test does exceed the threshold, then the process concludes in step 822 with a status of fail.

Figure 10:
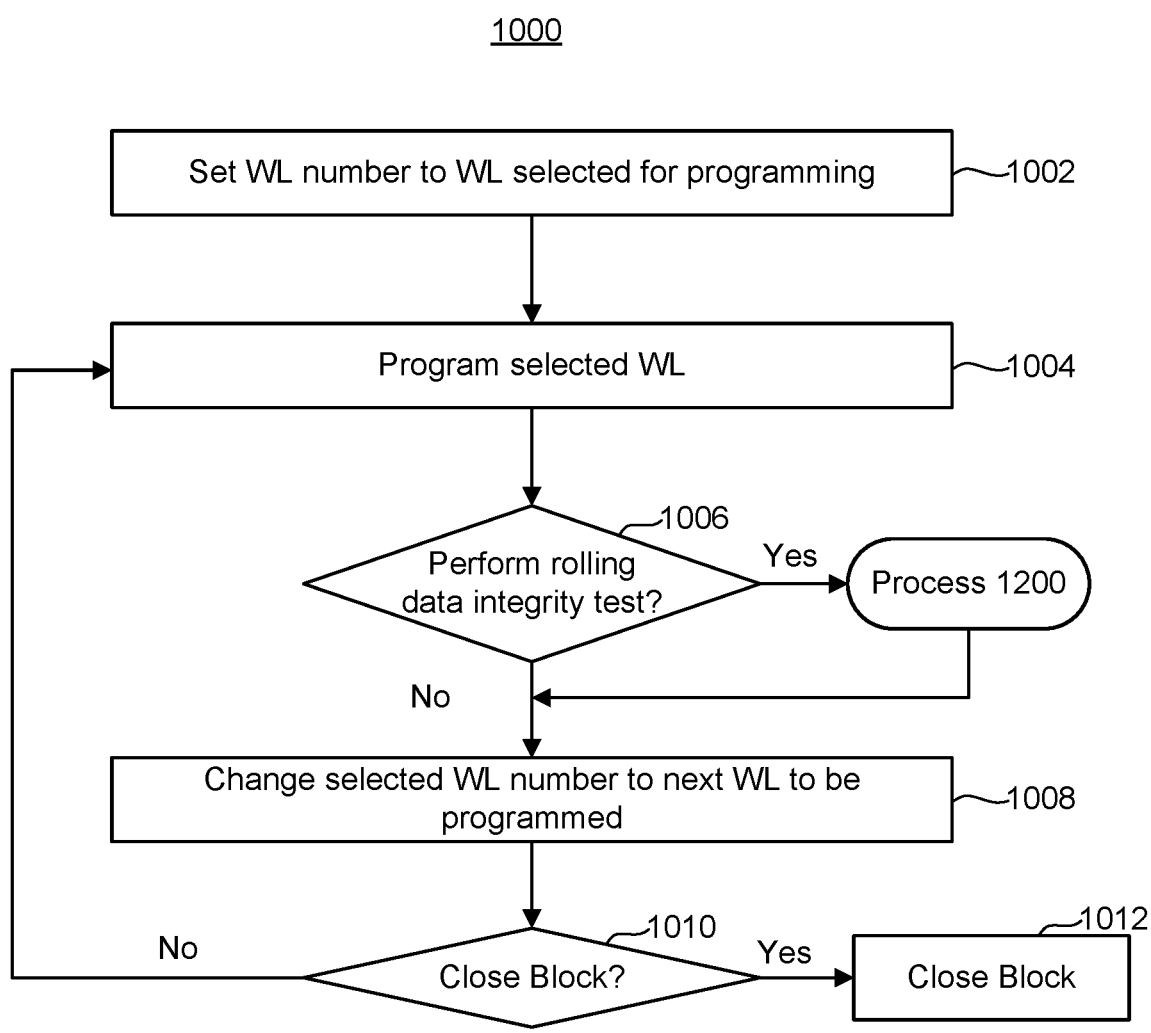
FIG. 10 is a flowchart of one embodiment of a process of programming open blocks when in a data integrity mode that checks certain word lines.

FIG. 10 is a flowchart of one embodiment of a process 1000 of programming open blocks when in a data integrity mode that checks certain word lines. The process 1000 may be performed by, but is not limited to, a combination of one or more of memory controller 102, system control logic 360, control circuitry 310, and/or row control circuitry 320. Step 1002 includes setting the WL number to the WL selected for programming. In an embodiment, programming proceeds from WL0 to WLn, wherein WL0 is nearest the source line and WLn is nearest the bit lines. However, programming is not required to proceed from source line to bit lines. In one embodiment, the order depends on whether an upper tier 421 or lower tier 423 is being programming. For example, programming can be in one direction (e.g., WL order) in the upper tier and the other direction in the lower tier. In an embodiment, the upper tier and the lower tier can be operated as separate blocks for erase/program purposes (e.g., separate erase blocks). For the sake of discussion an example will be discussed in which programming is performed from WL0 to WLn.

Step 1004 includes programming the selected word line. In an embodiment, the process of FIG. 6 may be used to program the selected word line. Step 1006 includes a determination of whether to perform a rolling data integrity test. In an embodiment, the rolling data integrity test of a word line at a certain location is performed if a word line at that location is a "susceptible word line". Recall that the list of susceptible word lines may include word line locations having a previous program or read failure. In an embodiment, WLx may be tested after programming WLx+1. In an embodiment, the rolling data integrity test of WLx is performed in response to WLx being a "susceptible word line". Note that it is possible that programming the memory cells connected to WLx+1 could impact the data stored in the memory cells connected to WLx. If the rolling data integrity test is to be performed following the programming of the presently selected WL, then process 1200 is performed. Process 1200 will be discussed below. If the rolling data integrity test is not to be performed following the programming of the presently selected WL then process 1200 is not performed. Step 1008 includes changing the selected WL number to the next WL to be programmed. In one embodiment, step 1008 includes incrementing the WL number. In one embodiment, step 1008 includes decrementing the WL number. Step 1010 is a determination of whether to close the block. The block is closed in step 1012 after all word lines have been programmed. Note that if the upper tier and lower tier are programed/erased separately the erase block is closed in step 1012 after all word lines in the tier (or erase block) have been programmed. If there are still more word lines to be programmed, then the process continues at step 1004.

FIGS. 11A-11C depict tables that shows program/erase status of word lines in an open block and whether to test a word line for data integrity. These tables will be discussed to further elaborate on an embodiment of process 1000. Table 1110 in FIG. 11A shows an example in which WL0-WL9 have been programmed, but WL10-WL31 are still erased. In this example WL8 is on the list of word lines to potentially test for data integrity. Because WL8 and WL9 have been programmed, WL8 will be tested for data integrity at this time. However, none of the other word lines are tested for data integrity at this time. Table 1120 in FIG. 11B shows a continuation of the example of FIG. 11A in which now WL0-WL19 have been programmed, but WL20-WL31 are still erased. In this example WL18 is on the list of word lines to potentially test for data integrity (WL8 is no longer listed for test as it was previously tested for data integrity in earlier stages of programming the block). Because WL18 and WL19 have been programmed, WL18 will be tested for data integrity at this time. However, none of the other word lines are tested for data integrity at this time. Table 1130 in FIG. 11C shows a further continuation of the present example in which WL0-WL27 have now been programmed, but WL28-WL31 are still erased. In this example WL26 is on the list of word lines to potentially test for data integrity (WL8 and WL18 are no longer listed for test as they were previously tested for data integrity in earlier stages of programming the block). Because WL26 and WL27 have been programmed, WL26 will be tested for data integrity at this time. However, none of the other word lines are tested for data integrity at this time.

Figure 12:
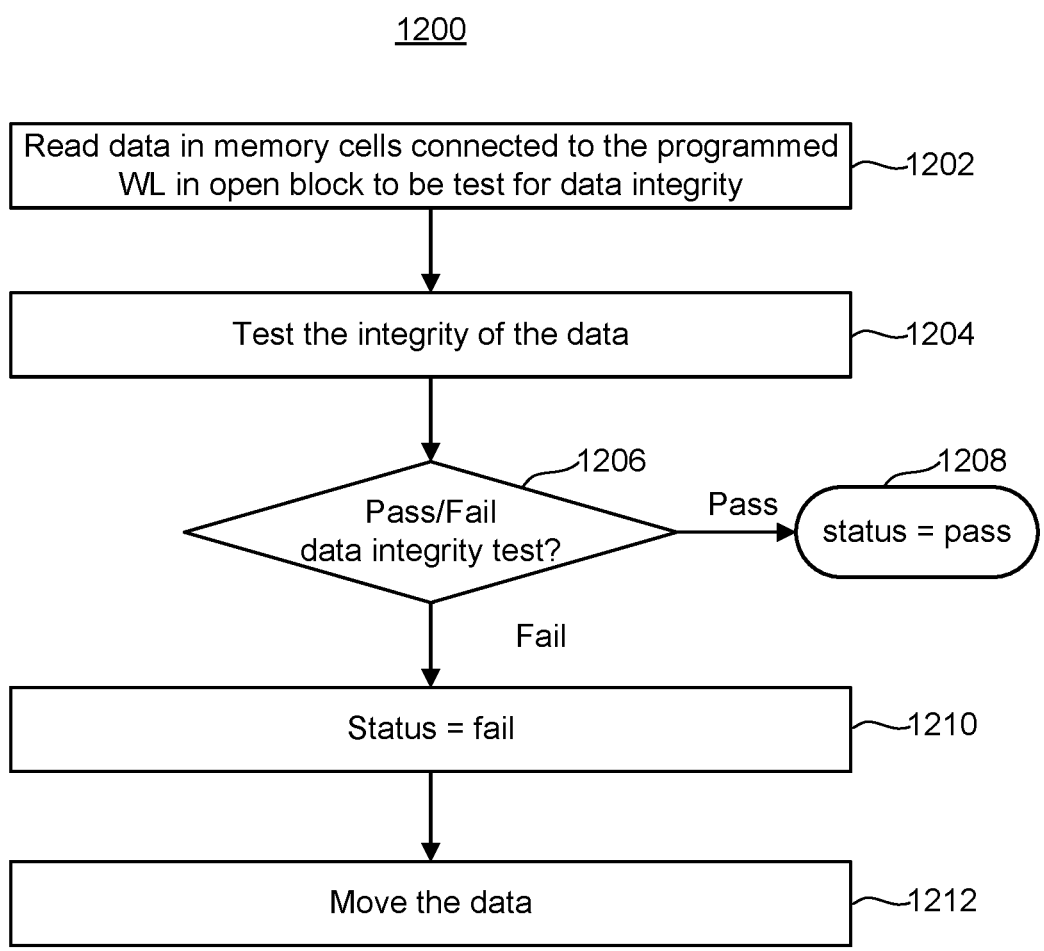
FIG. 12 is a flowchart of one embodiment of a process of performing a rolling data integrity check in an open block.

FIG. 12 is a flowchart of one embodiment of a process 1200 of performing a rolling data integrity check in an open block. The process 1200 may be performed by, but is not limited to, a combination of one or more of memory controller 102, system control logic 360, control circuitry 310, and/or row control circuitry 320. Process 1200 may be performed in one embodiment of step 706 in FIG. 7. In one embodiment, process 1200 will test the same set of word lines (e.g., word line locations or numbers) that were tested in the closed block data integrity test. Process 1200 describes testing one set of memory cells, which in one embodiment, are the WLx cells discussed in connection with process 1000.

Step 1202 includes reading data in memory cells connected to the selected word line. Step 1202 is not required to read every memory cell connected to the selected word line, but that is one possibility. The data will be stored in the memory cells are one or more ECC codewords. Typically, there will be multiple ECC codewords stored in the memory cells connected to one word line. At least one ECC codeword is read in step 1202. In one embodiment, the memory cells are read at hard bit reference levels.

Step 1204 includes testing the integrity of the data that was read in step 1202. In one embodiment, the data is transferred from the memory die to the memory controller 102, which uses the ECC engine 226/256 to decode the one or more ECC codewords. However, On-Chip ECC engine 363 could be used. In one embodiment, the ECC decoder determines a syndrome weight of an ECC codeword. In one embodiment, the ECC decoder determines a BER for the data. The BER may be, for example, the number of bits in error per some unit (size) of data. The data integrity may be judged based on the syndrome, BER or some other measure. As one example, the data integrity test passes if the BER is below some threshold BER. As another example, the data integrity test passes if the syndrome weight is below some threshold syndrome weight.

Step 1206 includes a determination of whether the data integrity test passed. In one embodiment, If the data integrity test passes, then the status is set to pass in step 1208. If the data integrity test fails, then the status set to fail in step 1210. In step 1212 the data may be moved. The data could be move to a different word line in the open block or to a different open block. The XOR data may be used in the event that the ECC decoder is unable to decode the data during the data integrity test.

In some embodiments, a word line is added to the list of word lines to be tested for data integrity. Therefore, the storage system 100 may adapt to changing conditions in the memory structure 302. FIG. 13A is a flowchart of one embodiment of a process 1300 of adding a word line to the list in response to a program failure. Process 1300 may be performed in connection with programming an open block. Step 1302 includes programming word lines in the open block. Step 1304 is a determination of whether there was a program failure of any word line in the open block. One example of a program failure is a status of fail (e.g., step 624) when performing the process of FIG. 6. However, a program failure is not limited to this example. If none of the word lines had a program failure, then the process 1300 ends in step 1306 without further action. However, if at least one word line had a program failure then the location of that word line (e.g., WL number) is added in step 1308 to the list of the word lines to check for data integrity. Note that this list may be used for the closed blocks and/or the other open blocks.

FIG. 13B is a flowchart of one embodiment of a process 1350 of adding a word line to the list in response to a read failure. Process 1350 may be performed in connection with reading all or a portion of a block. The block may be a closed block or an open block. An open block read could occur, for example, if a request to read user data is received while the block is still open. Step 1352 includes reading one or more word lines in the block. In one embodiment, the memory cells are read using hard bit reference levels. In one embodiment, the memory cells are read using both hard bit reference levels and soft bit reference levels. However, it is not required that the storage system use soft bit reference levels to read the cells in step 1352. Also note that one technique to read data in a group of cells is to re-read the memory cells after the hard bit references levels have been adjusted. Such an adjustment to the hard bit references levels may be made in step 1352, but is not required.

Step 1354 is a determination of whether there was a read failure of any word line in the block. One example of a read failure is the inability to decode one or more ECC codewords using an ECC decoder. As noted above, memory cells can be read using hard bit reference levels, or with a combination of hard bit reference levels and soft bit reference levels. One type of a read failure is the failure to decode one or more ECC codewords read from the memory cells using only hard bit reference level. Another type of a read failure is the failure to decode one or more ECC codewords read from the memory cells using both hard bit reference levels and soft bit read reference levels. Another type of a read failure is the failure to decode one or more ECC codewords read from the memory cells after the hard bit references levels have been adjusted. The definition of read failure in step 1354 may include, but is not limited to these examples. In general, the definition of read failure in step 1354 is that a group of memory cells connected to a word line are read in step 1352 (possibly using different reading techniques—for example, different read reference levels), but the data stored therein is not determined by ECC decoding.

If none of the word lines in this block had a read failure at this time, then the process 1350 ends without further action (step 1356). However, if at least one word line had a read failure then the location of that word line (e.g., WL number) is added in step 1358 to the list of the word lines to check for data integrity. Note that this list may be used for closed blocks and/or open blocks.

In view of the foregoing, a first embodiment includes an apparatus comprising one or more control circuits configured to connect to a memory structure. The memory structure comprising physical blocks having NAND strings. Each physical block has a group of word lines, wherein each word line of a physical block connects to all NAND strings in the physical block. Each physical block comprises one or more erase blocks. The one or more control circuits configured to perform a first data integrity check of data stored in memory cells connected to a first subset of word lines in closed blocks of the erase blocks. The first subset of the word lines being located at a corresponding first set of locations in the closed blocks. The one or more control circuits configured to perform a second data integrity check of data stored in memory cells connected to a second subset of word lines in open blocks of the erase blocks responsive to a determination that more than an allowed number of the first subset of the word lines fail the first data integrity check in a closed block. The second subset of the word lines being located at a corresponding second set of locations in the open blocks.

In a further embodiment, the allowed number of the first subset of the word lines is a number of word lines for which data can be recovered with XOR data stored in the apparatus.

In a further embodiment, the first data integrity check in the closed blocks comprises a determination of whether a bit error rate (BER) of data stored in a group of memory cells is greater than a threshold.

In a further embodiment, the one or more control circuits are further configured to perform the second data integrity check of a target word line in an open block after programming a word line adjacent to the target word line in the open block, The adjacent word line is programed after the target word line. The second data integrity check of the target word line includes reading data stored in memory cells connected to the target word line, and determining whether a bit error rate (BER) of the data read from the memory cells connected to the target word line is greater than a threshold.

In a further embodiment, the one or more control circuits are further configured to move the data that was stored in the memory cells connected to the target word line to another location in the memory structure responsive to a failure to decode the data read from the memory cells connected to the target word line.

In a further embodiment, the one or more control circuits are further configured to add a word line to the first subset of the word lines responsive to a read failure. The read failure comprises a failure to decode an ECC codeword read from a group of memory cells connected to a target word line in a target block. The word line added to the first subset has a location that corresponds to the location of target word line in the target block.

In a further embodiment, the one or more control circuits are further configured to add a word line to the first subset of the word lines responsive to a program failure of a target word line in a target block. The word line added to the first subset has a location that corresponds to the location of target word line in the target block.

In a further embodiment, the second subset of the word lines have the same respective locations in the open blocks as the first subset of word lines in the closed blocks.

In a further embodiment, the one or more control circuits are further configured to operate in a first mode in which the first data integrity check is performed in closed blocks until more than the allowed number of the first subset of the word lines fail the first data integrity check in a closed block. The one or more control circuits are further configured to operate in a second mode in which the second data integrity check is performed in open blocks responsive to more than the allowed number of the first subset of the word lines fail the first data integrity check in a closed block. The second data integrity check is not performed in the open blocks prior to more than the allowed number of the first subset of the word lines failing the first data integrity check in a closed block. The second data integrity check comprises a rolling data integrity check in which the second data integrity check of a target word line in an open block is performed after programming a word line adjacent to the target word line in the open block. The adjacent word line is programmed after the target word line.

In a further embodiment, the apparatus comprises a first semiconductor die that comprises the memory structure. The apparatus comprises a second semiconductor die bonded to the first semiconductor die. The second semiconductor die comprises at least a subset of the one or more control circuits.

One embodiment includes a method of operating non-volatile storage having erase blocks of memory cells. The method comprises operating the non-volatile storage a first mode in which a first data integrity check is performed in closed blocks of the erase blocks until more than an allowed number of word lines fail the first data integrity check in a closed block. The method comprises operating the non-volatile storage in a second mode in which a second data integrity check is performed in open blocks of the erase blocks responsive to more than the allowed number of the word lines failing the first data integrity check in the closed block. The second data integrity check is not performed in the open blocks prior to more than the allowed number of word lines failing the first data integrity check in a closed block. The second data integrity check comprises checking integrity of data programmed into memory cells connected to a target word line in an open block after programming a word line adjacent to the target word line in the open block.

One embodiment includes a non-volatile storage system comprising a memory structure comprising physical blocks having NAND strings. Each physical block comprises a group of word lines with each word line connected to all NAND strings in the physical block. Each physical block comprises one or more erase blocks. The non-volatile storage system comprises means for operating the non-volatile storage a first mode in which a first data integrity check is performed in closed blocks of the erase blocks until more than an allowed number of word lines fail the first data integrity check in a closed block. The non-volatile storage system comprises means for operating the non-volatile storage in a second mode in which a second data integrity check is performed in open blocks of the erase blocks responsive to more than the allowed number of the word lines failing the first data integrity check in the closed block, wherein the second data integrity check is not performed in open blocks prior to more than the allowed number of the word lines failing the first data integrity check in the closed block.

In an embodiment, the means for operating the non-volatile storage a first mode in which a first data integrity check is performed in closed blocks until more than an allowed number of word lines fail the first data integrity check in a closed block comprises one or more of memory controller 102, ECC engine 226/256, On-Chip ECC engine 363, system control logic 360, state machine 362, power control 364, column control circuitry 310, row control circuitry 320, an FPGA, an ASIC, and/or an integrated circuit. In one embodiment, the means for operating the non-volatile storage a first mode in which a first data integrity check is performed in closed blocks until more than an allowed number of word lines fail the first data integrity check in a closed block performs process 800 in FIG. 8.

In an embodiment, the means for operating the non-volatile storage in a second mode in which a second data integrity check is performed in open blocks responsive to more than the allowed number of the word lines failing the first data integrity check in the closed block comprises one or more of memory controller 102, ECC engine 226/256, On-Chip ECC engine 363, system control logic 360, state machine 362, power control 364, column control circuitry 310, row control circuitry 320, an FPGA, an ASIC, and/or an integrated circuit. In one embodiment, the means for operating the non-volatile storage a first mode in which a first data integrity check is performed in closed blocks until more than an allowed number of word lines fail the first data integrity check in a closed block performs process 1000 in FIG. 10 and/or process 1200 in FIG. 12.

In one embodiment, the non-volatile storage system further comprises means for adding a word line to the first subset of the word lines and to the second subset of the word lines. In an embodiment, the means for adding a word line to the first subset of the word lines and to the second subset of the word lines comprises one or more of memory controller 102, ECC engine 226/256, On-Chip ECC engine 363, system control logic 360, state machine 362, power control 364, column control circuitry 310, row control circuitry 320, an FPGA, an ASIC, and/or an integrated circuit. In one embodiment, the means for adding a word line to the first subset of the word lines and to the second subset of the word lines performs process 1300 in FIG. 13A and/or process 1350 in FIG. 13B.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
one or more control circuits configured to connect to a memory structure, the memory structure comprising physical blocks having NAND strings, each physical block having a group of word lines, wherein each word line of a physical block connects to all NAND strings in the physical block, wherein each physical block comprises one or more erase blocks, the one or more control circuits configured to:
perform a first data integrity check of data stored in memory cells connected to a first subset of word lines in closed blocks of the erase blocks, the first subset of the word lines being located at a corresponding first set of locations in the closed blocks; and
perform a second data integrity check of data stored in memory cells connected to a second subset of word lines in open blocks of the erase blocks responsive to a determination that more than an allowed number of the first subset of the word lines fail the first data integrity check in a closed block, the second subset of the word lines being located at a corresponding second set of locations in the open blocks, wherein the second data integrity check is not performed for the second subset of word lines in the open blocks prior to more than the allowed number of the first subset of the word lines failing the first data integrity check in the closed block.

2. The apparatus of claim 1, wherein the allowed number of the first subset of the word lines is a number of word lines for which data can be recovered with XOR data stored in the apparatus.

3. The apparatus of claim 1, wherein the first data integrity check in the closed blocks comprises a determination of whether a bit error rate (BER) of data stored in a group of memory cells is greater than a threshold.

4. The apparatus of claim 1, wherein the one or more control circuits are further configured to:
perform the second data integrity check of a target word line in an open block after programming a word line adjacent to the target word line in the open block, wherein the adjacent word line is programmed after the target word line, including:
read data stored in memory cells connected to the target word line; and
determine whether a bit error rate (BER) of the data read from the memory cells connected to the target word line is greater than a threshold.

5. The apparatus of claim 4, wherein the one or more control circuits are further configured to:
move the data that was stored in the memory cells connected to the target word line to another location in the memory structure responsive to a failure to decode the data read from the memory cells connected to the target word line.

6. The apparatus of claim 1, wherein the one or more control circuits are further configured to:
add a word line to the first subset of the word lines responsive to a read failure, wherein the read failure comprises a failure to decode an ECC codeword read from a group of memory cells connected to a target word line in a target block, wherein the word line added to the first subset has a location that corresponds to the location of target word line in the target block.

7. The apparatus of claim 1, wherein the one or more control circuits are further configured to:
add a word line to the first subset of the word lines responsive to a program failure of a target word line in a target block, wherein the word line added to the first subset has a location that corresponds to the location of target word line in the target block.

8. The apparatus of claim 1, wherein the second subset of the word lines have the same respective locations in the open blocks as the first subset of word lines in the closed blocks.

9. The apparatus of claim 1, wherein the one or more control circuits are further configured to:
operate in a first mode in which the first data integrity check is performed in closed blocks until more than the allowed number of the first subset of the word lines fail the first data integrity check in a closed block; and
operate in a second mode in which the second data integrity check is performed in open blocks responsive to more than the allowed number of the first subset of the word lines fail the first data integrity check in a closed block, wherein the second data integrity check comprises a rolling data integrity check in which the second data integrity check of a target word line in an open block is performed after programming a word line adjacent to the target word line in the open block, wherein the adjacent word line is programmed after the target word line.

10. The apparatus of claim 1, wherein the apparatus comprises:
a first semiconductor die that comprises the memory structure; and
a second semiconductor die bonded to the first semiconductor die, the second semiconductor die comprises at least a subset of the one or more control circuits.

11. A method of operating non-volatile storage having erase blocks of memory cells, the method comprising:
operating the non-volatile storage a first mode in which a first data integrity check is performed in closed blocks of the erase blocks until more than an allowed number of word lines fail the first data integrity check in a closed block; and
operating the non-volatile storage in a second mode in which a second data integrity check is performed in open blocks of the erase blocks responsive to more than the allowed number of the word lines failing the first data integrity check in the closed block, wherein the second data integrity check is not performed in the open blocks prior to more than the allowed number of word lines failing the first data integrity check in a closed block, the second data integrity check comprising checking integrity of data programmed into memory cells connected to a target word line in an open block after programming a word line adjacent to the target word line in the open block, wherein the adjacent word line is programmed after the target word line.

12. The method of claim 11, wherein the allowed number of the word lines is a number of word lines for which data stored in memory cells can be recovered with XOR data.

13. The method of claim 11, wherein operating the non-volatile storage the first mode in which the first data integrity check is performed in closed blocks until more than the allowed number of word lines fail the first data integrity check in a closed block comprises:
determining, for each of a first subset of word lines in closed blocks, whether a bit error rate (BER) of data stored in a group of memory cells is greater than a first threshold, wherein the first subset of the word lines are located at a corresponding first set of locations in the closed blocks.

14. The method of claim 13, wherein operating the non-volatile storage in the second mode in which the second data integrity check is performed in the open blocks comprises:
determining, for each of a second subset of word lines in open blocks, whether a bit error rate (BER) of data stored in a group of memory cells is greater than a second threshold, including determining the bit error rate (BER) of data stored in a group of memory cells connected to the target word line after data is programmed into a word line that neighbors the target word line, wherein the second subset of the word lines are located at a corresponding second set of locations in the open blocks.

15. The method of claim 14, wherein the second subset of the word lines in the open blocks have the same locations in the closed blocks as the first subset of word lines in the closed blocks.

16. A non-volatile storage system comprising:
a memory structure comprising physical blocks having NAND strings, wherein each physical block comprises a group of word lines with each word line connected to all NAND strings in the physical block, wherein each physical block comprises one or more erase blocks;
means for operating the non-volatile storage a first mode in which a first data integrity check is performed in closed blocks of the erase blocks until more than an allowed number of word lines fail the first data integrity check in a closed block; and means for operating the non-volatile storage in a second mode in which a second data integrity check is performed in open blocks of the erase blocks responsive to more than the allowed number of the word lines failing the first data integrity check in the closed block, wherein the second data integrity check is not performed in open blocks prior to more than the allowed number of the word lines failing the first data integrity check in the closed block.

17. The non-volatile storage system of claim 16, wherein the allowed number of the word lines is a number of word lines for which data can be recovered with XOR data stored in the non-volatile storage system.

18. The non-volatile storage system of claim 16, wherein the means for operating the non-volatile storage in the second mode in which the second data integrity check is performed in open blocks is configured to perform the second data integrity check of a target word line in an open block after programming a word line adjacent to the target word line in the open block, the adjacent word line is programmed after the target word line.

19. The non-volatile storage system of claim 16, wherein:
the means for operating the non-volatile storage the first mode in which the first data integrity check is performed in the closed blocks comprises means for determining, for each of a first subset of word lines in closed blocks, whether a bit error rate (BER) of data stored in a group of memory cells is greater than a first threshold, wherein the first subset of the word lines are at a corresponding first set of locations in the closed blocks; and
the means for operating the non-volatile storage in the second mode in which the second data integrity check is performed in open blocks comprises means for determining, for each of a second subset of word lines in the open blocks, whether a bit error rate (BER) of data stored in a group of memory cells is greater than a second threshold, wherein the second subset of the word lines are at a corresponding second set of locations in the open blocks, wherein the second subset of the word lines contain the first subset of the word lines.

20. The non-volatile storage system of claim 19, further comprising means for adding a word line to the first subset of the word lines and to the second subset of the word lines responsive to:
a program failure of a word line in an open block; or
a read failure of a word line in a closed block or an open block.

* * * * *